(12) United States Patent
Jang et al.

(10) Patent No.: US 11,636,805 B2
(45) Date of Patent: Apr. 25, 2023

(54) DISPLAY DEVICE AND DRIVING METHOD OF THE SAME

(71) Applicant: LG Display Co., Ltd., Seoul (KR)

(72) Inventors: YongHo Jang, Gyeonggi-do (KR); Younghyun Ko, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/469,682

(22) Filed: Sep. 8, 2021

(65) Prior Publication Data

US 2022/0208094 A1 Jun. 30, 2022

(30) Foreign Application Priority Data

Dec. 24, 2020 (KR) .......................... 10-2020-0183972

(51) Int. Cl.
| | |
|---|---|
| *G09G 3/32* | (2016.01) |
| *G09G 3/3233* | (2016.01) |
| *G09G 3/20* | (2006.01) |
| *H01L 27/32* | (2006.01) |
| *H01L 29/786* | (2006.01) |
| *H01L 27/12* | (2006.01) |

(52) U.S. Cl.
CPC ......... *G09G 3/3233* (2013.01); *G09G 3/2007* (2013.01); *H01L 27/3262* (2013.01); *H01L 27/3265* (2013.01); *H01L 27/3276* (2013.01); *G09G 2300/0426* (2013.01); *G09G 2300/0819* (2013.01); *G09G 2300/0852* (2013.01); *H01L 27/124* (2013.01); *H01L 27/1225* (2013.01); *H01L 27/1237* (2013.01); *H01L 27/1255* (2013.01); *H01L 29/7869* (2013.01)

(58) Field of Classification Search
CPC ......... G09G 3/3233; G09G 2300/0861; G09G 2300/0426; G09G 2320/043; G09G 2310/0262; G09G 3/3241; G09G 2320/045; G09G 2300/043; G09G 2300/0439; G09G 2310/0278; G09G 2310/0272; G09G 3/2007; G09G 2320/0214; G09G 2310/021; G09G 2300/0814; G09G 3/3258; G09G 3/3266; G09G 3/325; G09G 2320/0233; G09G 2300/0852; H01L 27/3262; H01L 27/3265; H01L 27/3248; H01L 27/3276; H01L 28/40; H01L 27/1255; H01L 29/7869; H01L 29/786; G02F 1/136213; G02F 1/136286

See application file for complete search history.

(56) References Cited

U.S. PATENT DOCUMENTS

| | | | |
|---|---|---|---|
| 9,786,222 B2 * | 10/2017 | Lim | G09G 3/3233 |
| 2018/0190194 A1 * | 7/2018 | Zhu | H01L 27/12 |
| 2018/0211600 A1 * | 7/2018 | Nie | G09G 3/3225 |
| 2019/0164476 A1 * | 5/2019 | Feng | G09G 3/3225 |
| 2020/0135091 A1 * | 4/2020 | Kim | G09G 3/3233 |
| 2020/0410927 A1 * | 12/2020 | Wang | G09G 3/3275 |
| 2021/0201790 A1 * | 7/2021 | Gai | G09G 3/3291 |

* cited by examiner

*Primary Examiner* — Duc Q Dinh
(74) *Attorney, Agent, or Firm* — Seed IP Law Group LLP

(57) ABSTRACT

The present specification provides a display device and a driving method thereof performing sampling for sensing a sampling voltage of a driving transistor using a fast mode in which a driving transistor operates by a sampling voltage formed in one storage capacitor, and data writing using the slow mode in which the driving transistor is operated by a data voltage formed in another storage capacitor.

18 Claims, 28 Drawing Sheets

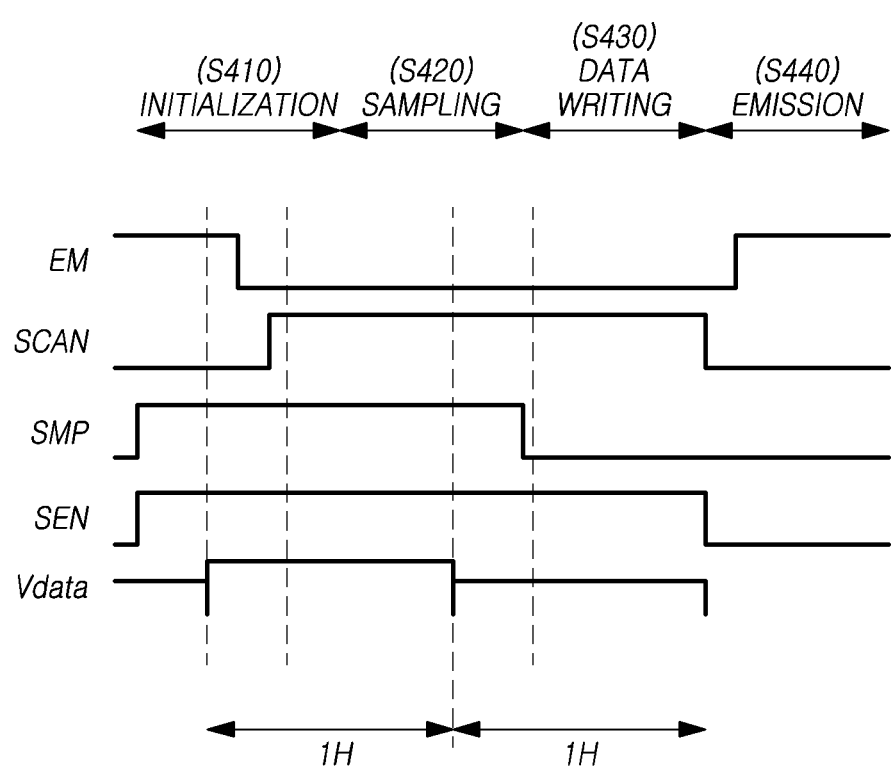

DISPLAY DEVICE AND DRIVING METHOD OF THE SAME

CROSS REFERENCE TO RELATED APPLICATION

This application claims priority from Korean Patent Application No. 10-2020-0183972, filed on Dec. 24, 2020, which is hereby incorporated by reference for all purposes as if fully set forth herein.

BACKGROUND

Technical Field

The present disclosure relates to a display device displaying an image and a driving method of a display device.

Description of the Related Art

As the information-oriented society has been developed, various needs for display devices for displaying an image have increased. Recently, various types of display devices, such as a Liquid Crystal Display (LCD) device, a Plasma Display Panel (PDP) device, and an Organic Light Emitting display device, have been utilized.

A display device includes a driving circuit including a driving transistor. The driving transistor is driven by applying a data voltage to the top or bottom of the channel layer of the driving transistor using one gate electrode.

SUMMARY

As described above, various approaches in the related art involved using a driving transistor including one gate electrode. However, the inventors of the present disclosure have recognized and appreciated that since the driving transistor using one gate electrode uses only a single channel of the gate electrode and the channel layer, there is a limitation in simultaneously performing two or more operations, for example, sampling and writing data.

Considering the technical problems mentioned above as well as other problems in the related art, the inventors have suggested one or more embodiments of the present disclosure that provides a display device and a driving method thereof that perform fast sampling during a sampling operation and improve a data voltage margin during a data write operation.

In one aspect, embodiments of the present disclosure may perform sampling for sensing a sampling voltage using a fast mode in which a driving transistor operates by a sampling voltage stored in one storage capacitor, and perform data writing using a slow mode in which the driving transistor is operated by a data voltage stored in another storage capacitor.

An aspect of the present disclosure may provide a display device including: an organic light-emitting diode; a driving transistor electrically connected between the first electrode of the organic light emitting diode and a driving voltage line and including a first gate node and a second gate node; a first transistor electrically connected between a first gate node of the driving transistor and a data line; a second transistor electrically connected to the sensing line; a first storage capacitor electrically connected between the first gate node and a second node of the driving transistor; a third transistor electrically connected between the driving voltage line and the driving transistor; a fourth transistor electrically connected between the third transistor and the second gate node of the driving transistor; and a second storage capacitor electrically connected between the second gate node and the second node of the driving transistor.

Another aspect of the present disclosure may provide a driving method for driving a driving circuit including an organic light emitting diode, a driving transistor driving the organic light emitting diode and including a first gate electrode and a second gate electrode, a first storage capacitor electrically connected between the organic light emitting diode, a specific node of the driving transistor and the first gate electrode, and a second storage capacitor electrically connected between the specific node and the second gate electrode: storing a difference value between a reference voltage and an initialization voltage in the first storage capacitor, and storing a difference value between a driving voltage and an initialization voltage in the second storage capacitor to initialize; performing sampling for sensing the sampling voltage using a fast mode in which the driving transistor operates by a sampling voltage stored in the second storage capacitor; performing data writing using a slow mode in which the driving transistor operates by a data voltage stored in the first storage capacitor; and emitting light from the organic light emitting diode by a driving current of the driving transistor.

According to embodiments of the present disclosure, a display device and a driving method thereof may perform fast sampling during a sampling operation and improve a data voltage margin during a data write operation.

BRIEF DESCRIPTION OF THE DRAWINGS

FIG. 19 illustrates an example of a method of driving the subpixel SP3 of FIG. 18.

DETAILED DESCRIPTION

Figure 1:
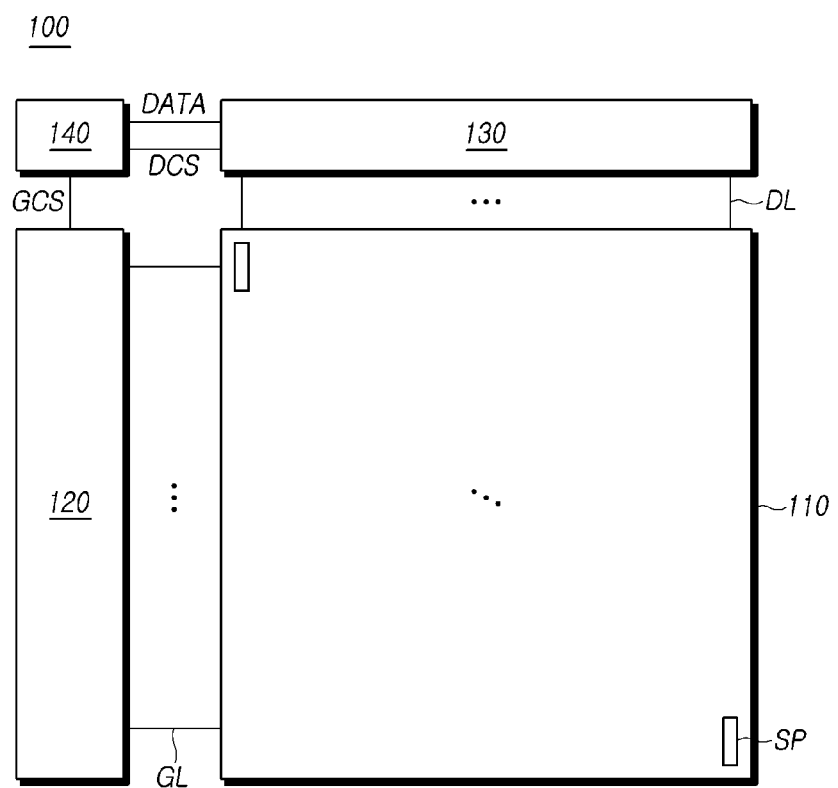
FIG. 1 illustrates a schematic configuration of a display device 100 according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B" "(A)," or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps" etc. a second element, it should be interpreted that, not only can the first element "be directly connected or coupled to" or "directly contact or overlap" the second element, but also a third element can be "interposed" between the first and second elements, or the first and second elements can "be connected or coupled to," "contact or overlap," etc. each other via a fourth element.

Here, the second element may be included in at least one of two or more elements that "are connected or coupled to," "contact or overlap." etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 illustrates a schematic configuration of a display device 100 according to embodiments of the present disclosure.

Referring to FIG. 1, a display device 100 according to an embodiment includes a display panel 110 in which a plurality of subpixels SP including a light emitting element are arranged, and a gate driving circuit 120, a data driving circuit 130, and a controller 140 for driving the display panel 110.

In the display panel 110, a plurality of gate lines GL and a plurality of data lines DL are disposed. A subpixel SP is adjacently disposed in a region where the gate line GL and the data line DL cross or overlap each other. Each of these subpixels SP may include a light emitting element, and two or more subpixels SP may constitute one pixel.

The gate driving circuit 120 is controlled by the controller 140, and sequentially outputs scan signals to the plurality of gate lines GL disposed on the display panel 110 to control the driving timing of the subpixels SP.

The gate driving circuit 120 may include one or more gate driver integrated circuits (GDICs), and may be located only on one side of the display panel 110 or both sides according to a driving method.

The data driving circuit 130 receives image data from the controller 140 and converts the image data into an analog data voltage. In addition, the data voltage is output to each data line DL according to a timing when a scan signal is applied through the gate line GL, so that each subpixel SP expresses brightness according to the image data.

The data driving circuit 130 may include one or more source driver integrated circuits (SDICs).

The controller 140 supplies various control signals to the gate driving circuit 120 and the data driving circuit 130, and controls the operation of the gate driving circuit 120 and the data driving circuit 130.

The controller 140 allows the gate driving circuit 120 to output the scan signal according to a timing implemented in each frame. The controller 140 converts the image data received from the outside according to a data signal format used by the data driving circuit 130 and outputs the converted image data to the data driving circuit 130.

The controller 140 receives various timing signals including a vertical synchronization signal Vsync, a horizontal synchronization signal Hsync, an input data enable signal DE, a clock signal CLK, and the like, together with the image data from outside (e.g., host system).

The controller 140 may generate various control signals using various timing signals received from the outside and output them to the gate driving circuit 120 and the data driving circuit 130.

For example, in order to control the gate driving circuit 120, the controller 140 outputs various gate control signals including a gate start pulse GSP, a gate shift clock GSC, a gate output enable signal GOE, etc.

Here, the gate start pulse GSP controls an operation start timing of one or more gate driver integrated circuits constituting the gate driving circuit 120. The gate shift clock GSC is a clock signal commonly input to one or more gate driver integrated circuits and controls shift timing of the scan signals. The gate output enable signal GOE specifies timing information of one or more gate driver integrated circuits.

In addition, in order to control the data driving circuit 130, the controller 140 outputs various data control signals including a source start pulse SSP, a source sampling clock SSC, a source output enable signal SOE, etc.

Here, the source start pulse SSP controls the data sampling start timing of one or more source driver integrated circuits constituting the data driving circuit 130. The source sampling clock SSC is a clock signal that controls the sampling timing of data in each of the source driver integrated circuits. The source output enable signal SOE controls the output timing of the data driving circuit 130.

Such a display device 100 supplies various voltages or currents to the display panel 110, the gate driving circuit 120, the data driving circuit 130, or the like. The display device 100 may further include a power management integrated circuit for controlling various voltages or currents to be supplied.

In the display panel 110, in addition to the gate line GL and the data line DL, a voltage line to which various signals or voltages are supplied may be disposed. The light emitting element, a transistor driving the light emitting element, or the like may be disposed in each subpixel SP.

Hereinafter, a circuit structure of the subpixel SP on the display panel 110 of the display device 100 according to embodiments will be described by an example.

Figure 2:
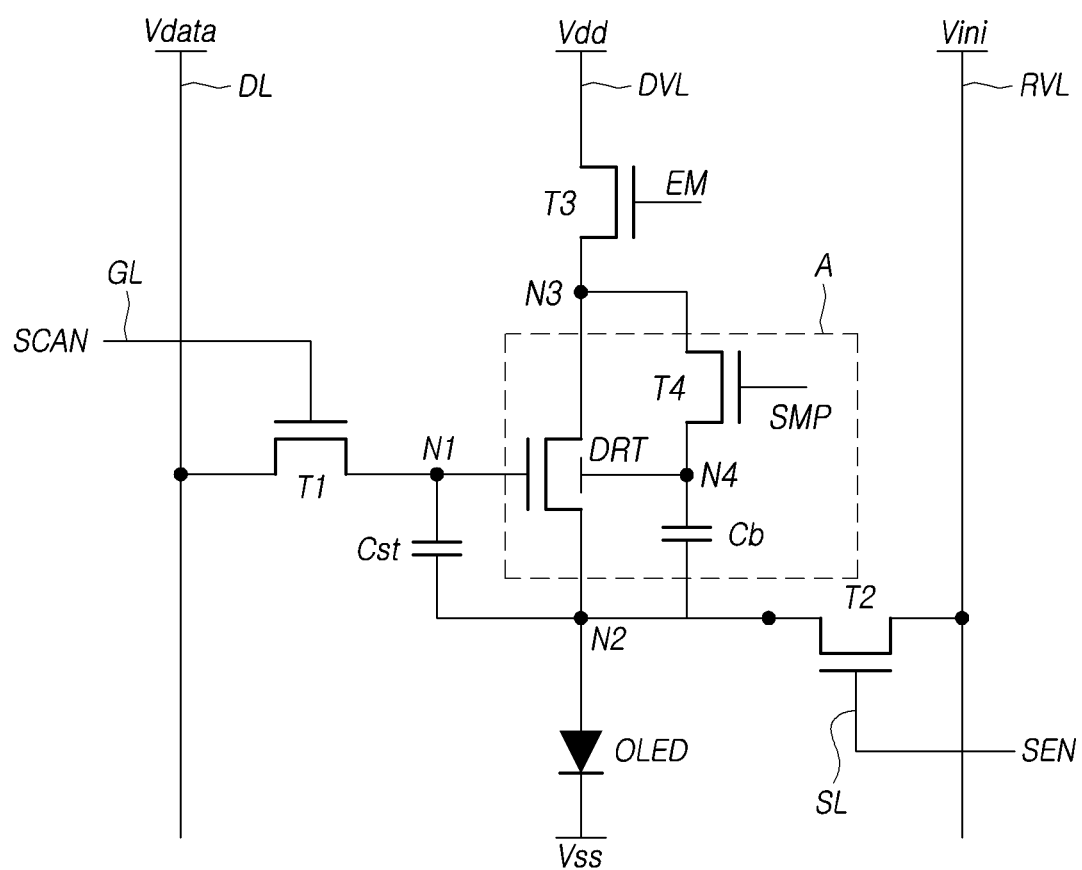
FIG. 2 is a circuit diagram of a subpixel according to an embodiment.

FIG. 2 is a circuit diagram of a subpixel according to an embodiment.

Referring to FIG. 2, a subpixel SP according to an embodiment includes an organic light emitting diode OLED and a driving circuit. The driving circuit includes a driving transistor DRT for driving the organic light emitting diode OLED, a first transistor T1, a second transistor T2, a third transistor T3, a fourth transistor T4, a first storage capacitor Cst, a second storage capacitor Cb, etc. The driving circuit may have a 5T2C structure including five transistors and two capacitors. However, the 5T2C structure is merely an example and various numbers of transistors and capacitors may be utilized to perform same or similar function as the circuit described in FIG. 2.

In addition, a gate line GL and a data line DL are disposed, and a driving voltage line DVL to which a driving voltage VDD is applied and the sensing line RVL to which an initialization voltage Vini are applied may be disposed in the subpixel SP. The driving voltage line DVL and the sensing line RVL may be disposed per one for each of two or more subpixels SP.

The driving transistor DRT is electrically connected between the first electrode of the organic light emitting diode OLED and the driving voltage line DVL. The driving transistor DRT includes a first gate node N1 as a first node, a source node N2 as a second node, a drain node N3 as a third node, and a second gate node N4 as a fourth node. In some embodiments, the driving transistor DRT may be referred to as fourth terminal driving transistor.

The driving transistor DRT is turned on by the data voltage Vdata applied to the first gate node N1, and controls the driving voltage VDD to be applied to the organic light emitting diode OLED according to the data voltage Vdata. The driving transistor DRT maintains the first gate node N1 and the source voltage Vs constant, and performs a sampling operation of forming a sampling voltage between the second gate node N4 and the source node N2 according to the fluctuation of the second gate voltage and a data writing operation of writing gray scale data according to the data voltage Vdata of the first gate node N1.

The first transistor T1 is electrically connected between the data line DL and the first gate node N1 of the driving transistor DRT. In addition, the gate node of the first transistor T1 may be electrically connected to or integrally formed with the gate line GL.

The first transistor T1 is turned on and off by the scan signal SCAN applied to the gate line GL, and controls the data voltage Vdata supplied through the data line DL to be applied to the first gate node N1 of the driving transistor DRT. In some embodiments, this first transistor T1 is also referred to as a switching transistor.

The second transistor T2 is electrically connected between the sensing line RVL and the second node N2 of the driving transistor DRT. In addition, the gate node of the second transistor T2 may be electrically connected to or integrally formed with the sensing line SL.

The second transistor T2 is turned on and off by the sensing signal SEN applied to the sensing line SL, and controls the initialization voltage Vini supplied through the sensing line RVL to be applied to the second node N2 of the driving transistor DRT.

The first storage capacitor Cst is electrically connected between the first node N1 and the second node N2 of the driving transistor DRT. The first storage capacitor Cst may maintain the data voltage Vdata applied to the first gate node N1 of the driving transistor DRT for one frame.

The organic light emitting diode OLED represents the brightness according to the difference between the voltage applied to the first electrode by the driving transistor DRT and the base voltage VSS.

The third transistor T3 is electrically connected between the driving voltage line DVL supplying the driving voltage VDD and the driving transistor DRT. The third transistor T3 is an enable transistor that supplies the driving voltage VDD to the driving transistor DRT, and is turned on and off according to an enable signal EM.

The fourth transistor T4 is electrically connected between the third transistor T3 and the second gate node N4 of the driving transistor DRT. The fourth transistor T4 is turned on and off according to a control signal SMP.

The second storage capacitor Cb is electrically connected between the second gate node N4 and the second node N2 of the driving transistor DRT. As will be described later, in some embodiments, the second storage capacitor Cb may be built into the driving transistor DRT or may be separately configured externally.

During the initialization operation, the third transistor T3 and the fourth transistor T4 are turned on to apply the driving voltage VDD to the nodes N3 and N4. The second transistor T2 is turned on to apply the initialization voltage Vini to the second node N2. Accordingly, a predetermined voltage (Vbs=VDD−Vini) is formed in the second storage capacitor Cb between the second gate node N4 and the second node N2 of the driving transistor DRT.

During the sampling operation, the second storage capacitor Cb may maintain the driving voltage VDD applied to the second gate node N4 of the driving transistor DRT for a selected period. When the third transistor T3 is turned off, a sampling voltage Vsen related to the threshold voltage Vth of the driving transistor DRT is formed in the second storage capacitor Cb.

During the data writing operation, the first transistor T1 is turned on while the third transistor T3 is turned off, and the data voltage Vdata is applied to the first gate node N1 of the driving transistor DRT, and this data voltage Vdata is stored in the first storage capacitor Cst.

When the third transistor T3 is turned on while the first transistor T1 and the second transistor T2 are turned off, a voltage according to the data voltage Vdata stored in the first storage capacitor Cst is applied to the first electrode of the organic light emitting diode OLED, and the organic light emitting diode OLED emits light.

In the sub-pixel SP according to the above-described embodiment, the driving transistor DRT takes advantage of the four-terminal transistor in which the data writing channel by the channel layer and the first gate node N1 and the sampling channel by the same channel layer and the second gate node N4 are closely coupled, thereby selectively using one of the data writing channel and the sampling channel having different conductances in the data writing operation and the sampling operation.

Hereafter, a cross-sectional structure of a driving transistor DRT using a 4-terminal oxide transistor and driving and a connection relationship between the transistor DRT and the fourth transistor T4 with reference to a partial cross-sectional view of the driving transistor DRT and the fourth transistor T4 in the area A of FIG. 2 will be described.

Figure 3:
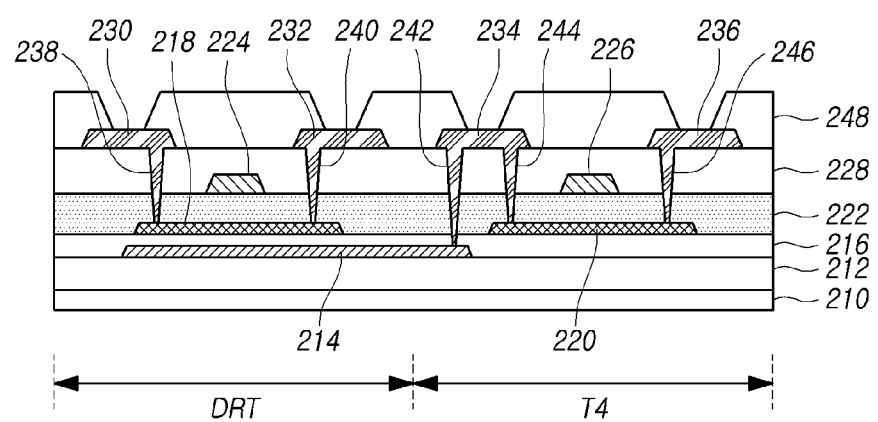
FIG. 3 is a partial cross-sectional view of a driving transistor and a fourth transistor in a region A of FIG. 2.

FIG. 3 is a partial cross-sectional view of a driving transistor and a fourth transistor in a region A of FIG. 2.

Referring to FIG. 3, a first insulating layer 212 is disposed on a substrate 210, and a second gate electrode 214 is patterned on the first insulating layer 212 at a position corresponding to the driving transistor DRT. The second gate electrode 214 corresponds to the second gate node N4 of FIG. 2.

A second insulating layer 216 is disposed on the first insulating layer 212 patterned with the second gate electrode 214, and an oxide semiconductor layers 218 and 220 are disposed on the second insulating layer 216 at positions corresponding to the driving transistor DRT and a fourth transistor T4. The oxide semiconductor layers 218 and 220 constitute a channel layer of the driving transistor DRT and the fourth transistor T4. The oxide semiconductor layers 218 and 220 are described as channel layers as an example, but may be other types of semiconductor layers.

A gate insulating layer 222 is disposed on the second insulating layer 216 on which the oxide semiconductor layers 218 and 220 are patterned, and The first gate electrode 224 of the driving transistor and the gate electrode 226 of the fourth transistor T4 are patterned at the position corresponding to the driving transistor DRT and the fourth transistor T4. The first gate electrode 224 corresponds to the first gate node N1 of FIG. 2.

An interlayer insulating layer 228 is disposed on the gate insulating layer 222 in which the first gate electrode 224 of the driving transistor DRT and the gate electrode 226 of the fourth transistor T4 are patterned. The source electrode 230 and drain electrode 232 of the driving transistor DRT and source electrode 234 and the drain electrode 236 of the fourth transistor T4 are disposed on the interlayer insulating layer 228.

The source electrode 230 and the drain electrode 232 of the driving transistor DRT contacts with the source region and the drain region of the oxide semiconductor layer 218 through a first contact hole 238 and a second contact hole 240 passing through the interlayer insulating layer 228 and the gate insulating layer 222.

One of the source electrode 234 and the drain electrode 236 of the fourth transistor T4 contacts with the second gate electrode 224 through the third contact hole 242 passing through the interlayer insulating layer 228, the gate insulating layer 222, and the second insulating layer 216. As a result, the second gate node N4 is electrically connected to the fourth transistor T4 through the third contact hole 242.

The source electrode 234 and the drain electrode 236 of the fourth transistor T4 contacts with the source region and the drain region of the oxide semiconductor layer 220 through a fourth contact hole 244 and a fifth contact hole 246 passing through the interlayer insulating layer 228 and the gate insulating layer 222.

A planarization layer 248 is disposed on the interlayer insulating layer 228. Layers forming the organic light-emitting diode OLED (not shown) is disposed on the planarization layer 248.

As shown in FIG. 3, only the gate electrode 226 is disposed on the oxide semiconductor layer 220 of the fourth transistor T4. In the driving transistor DRT, a first gate electrode 224 and a second gate electrode 214 are disposed above and below the oxide semiconductor layer 218. In addition, the second gate electrode 214 of the driving transistor DRT is electrically connected to one of the source electrode 234 and the drain electrode 236 of the fourth transistor T4 through the third contact hole 242.

In the driving transistor DRT, the capacitance of the second insulating layer 216 between the oxide semiconductor layer 218 and the second gate electrode 214 is may be smaller than the capacitance of the gate insulating layer 222 between the oxide semiconductor layer 218 and the first gate electrode 224. The capacitance is proportional to the dielectric constant of the dielectric and inversely proportional to the thickness thereof.

As an example, the thickness of the second insulating layer 216 between the oxide semiconductor layer 218 and the second gate electrode 214 in the driving transistor DRT is may be thinner the thickness of the gate insulating layer 222 between the oxide semiconductor layer 218 and the first gate electrode 224.

As another example, the dielectric constant of the second insulating layer 216 between the oxide semiconductor layer 218 and the second gate electrode 214 in the driving transistor DRT may be smaller than the dielectric constant of the gate insulating layer 222 between the oxide semiconductor layer 218 and the first gate electrode 224. That is, the dielectric constant of the material used as the second insulating layer 216 may be smaller than the dielectric constant of the material used as the gate insulating layer 222.

As described with reference to FIG. 3, a first gate electrode 224 as a first gate node is located on an oxide semiconductor layer 218 that is a channel layer of a driving transistor DRT, and a second gate electrode 214 as a second gate node is located under the oxide semiconductor layer 218 that is a channel layer of the driving transistor. The second gate electrode 214 is electrically connected to the second node of the fourth transistor T4 through the third contact hole 242. In this case, the oxide semiconductor layer 218 and the second gate electrode 224 constitute a top driving channel that is a data writing channel, and the oxide semiconductor layer 218 and the first gate electrode 214 constitute a bottom driving channel that is a sampling channel.

As another example, a first gate electrode 224 as a first gate node is located under an oxide semiconductor layer 218 that is a channel layer of a driving transistor DRT, and a second gate electrode 214 as a second gate node is located on the oxide semiconductor layer 218 that is a channel layer of the driving transistor. In this case, the oxide semiconductor layer 218 and the second gate electrode 224 constitute a bottom driving channel that is a data writing channel, and the oxide semiconductor layer 218 and the first gate electrode 214 constitute are a top driving channel that is a sampling channel.

In this case, the gate insulating layer 222 is located between the oxide semiconductor layer 218 and the second gate electrode 214 in the driving transistor DRT, and the second insulating layer 216 is located between the oxide semiconductor layer 218 and the first gate electrode 224. Therefore, the capacitance of the gate insulating layer 222 between the oxide semiconductor layer 218 and the second gate electrode 214 may be smaller than the capacitance of the second insulating layer 216 between the oxide semiconductor layer 218 and the first gate electrode 224. As mentioned above, the capacitance is proportional to the dielectric constant of the dielectric and inversely proportional to the thickness.

As an example, the thickness of the gate insulating layer 222 between the oxide semiconductor layer 218 and the second gate electrode 214 in the driving transistor DRT may be thinner that of the oxide semiconductor layer 218 and the first gate electrode 224 the second insulating layer 216.

As another example, the dielectric constant of the gate insulating layer 222 between the oxide semiconductor layer 218 and the second gate electrode 214 in the driving transistor DRT may be smaller than the dielectric constant of the second insulating layer 216 between the oxide semiconductor layer 218 and the first gate electrode 224. The dielectric constant of the material used as the gate insulating layer 222 may be smaller than the dielectric constant of the material used as the second insulating layer 216.

In general, if only the first gate electrode 224 is disposed above or below the oxide semiconductor layer 218 without the second gate electrode 214, the driving transistor DRT has a small S-factor so that the data voltage margin for displaying the gray area may be small. At this time, if the capacitance of the layer between the first gate electrode 224 and the oxide semiconductor layer 218 of the driving transistor DRT is reduced, the conductance, which is the rate of change of the current to the voltage change, increases so that the data voltage margin may increase. However, there has a disadvantage in that the sampling time is lengthened because the driving current of the driving transistor DRT is reduced in this case.

In general, in the sampling of the source follower method, the source voltage of the driving transistor DRT after sampling is different for each subpixel depending on the threshold voltage Vth, and in the diode connection method, the threshold voltage Vth of the driving transistor DRT has the opposite polarity, there has a disadvantage in that the sampling error is increased.

The above-described driving transistor DRT takes advantage of the four-terminal transistor in which the data writing channel by the oxide semiconductor layer 218 and the first gate electrode 224 and the sampling channel by the oxide semiconductor layer 218 and the second gate electrode 214 are closely coupled, thereby selectively use one of the data writing channel and the sampling channel having different conductances in the data writing operation and the sampling operation. Therefore there may is improved the disadvantage in that the sampling time is lengthened or the sampling error is increased.

Hereinafter, a method of driving a subpixel that selectively uses the data writing channel and the sampling channel having different conductances in the sampling step and the data writing step by the driving transistor DRT will be described.

Figure 4:
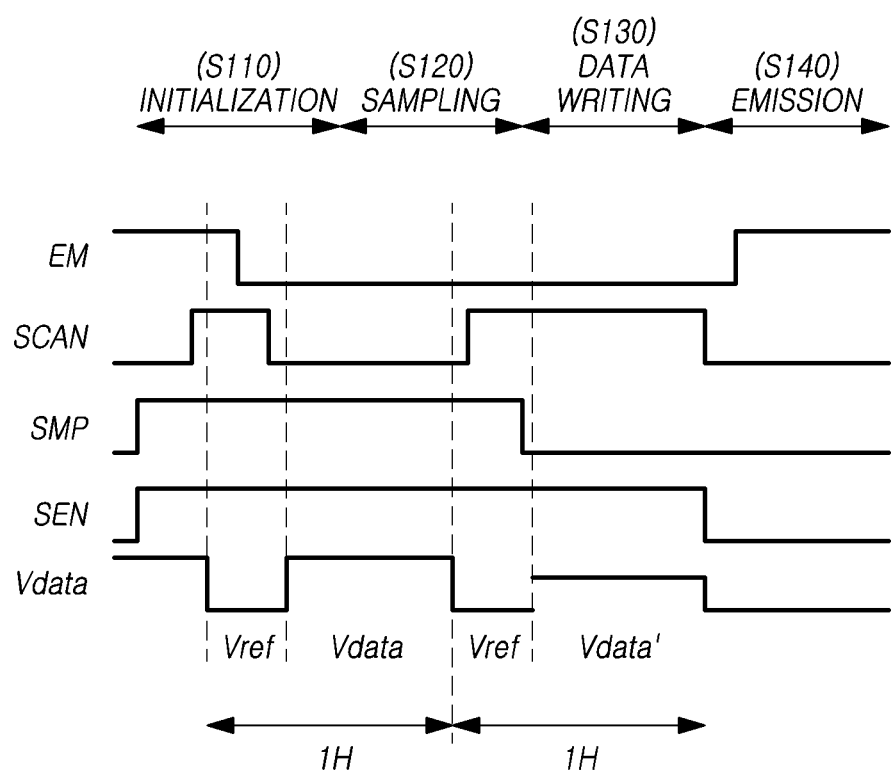
FIG. 4 is a timing diagram of driving the subpixel of FIG. 2.

FIG. 4 is a timing diagram of driving the subpixel of FIG. 2.

Referring to FIG. 4, the driving method of driving the subpixel SP of FIG. 2 includes an initialization step S110 of applying a selected voltage for driving to at least one of both ends of the first storage capacitor Cst and a sampling step S120 sensing the characteristic value (e.g., threshold voltage) of the driving transistor DRT, a data writing step S130 inputting data, and a light emission step S140 of emitting an organic light-emitting diode OLED.

1. In the initialization step S110, since an ON signal is applied as the enable signal EM and the control signal SMP, the third transistor T3 is turned on and the driving voltage VDD is applied to the second gate node N4. Since an on signal is applied as the sensing signal SEN, the second transistor T2 is turned on and the initialization voltage Vini is applied to the second node N2. Accordingly, a selected voltage (Vbs=VDD–Vini) is formed in the second storage capacitor Cb between the second gate node N4 and the second node N2 of the driving transistor DRT.

At this time, since an ON signal is also applied to the scan signal SCAN and the reference voltage Vref is supplied to the data line DL, the gate-source voltage (Vgs=Vref–Vini) of the driving transistor DRT is charged in the first storage capacitor Cst.

An OFF point of the enable signal EM is after charging of the second storage capacitor Cb, and an ON point of the enable signal EM is after writing of data.

2. In the sampling step S120, the sensing signal SEN and the control signal SMP are kept on and the enable signal EM is changed to an OFF state, so that the third transistor T3 is turned off. Thus, the sampling voltage Vsen related to the threshold voltage Vth of the driving transistor DRT is formed in the second storage capacitor Cb.

The first gate node N1 of the driving transistor DRT is maintained at the reference voltage Vref, and the second node is maintained at the initialization voltage Vini. In this case, the sampling is possible even when the threshold voltage Vth is negative, that is, when the reference voltage Vref is less than the initialization voltage Vini (Verf<Vini).

In the initialization step S110, the first gate node N1 and the second node N2 are maintained at the reference voltage Vref and the initialization voltage Vini, and, in the sampling step S120, fast sampling is performed using a fast mode or F mode in which the driving transistor DRT operates by the sampling voltage Vsen formed in the second storage capacitor Cb.

3. In a state in which the enable signal EM is turned off in the data writing step S130 so that no current flows through the driving transistor DRT, when an ON signal is applied to the scan signal SCAN and the first transistor T1 is turned on, the data voltage Vdata is applied to the first gate node N1. A gray display signal voltage Vdata–Vini, which is a difference between the data voltage Vdata and the initialization voltage Vini, is formed in the first storage capacitor Cst. The data writing step S130 may increase the gray voltage margin displayed on the screen using a slow mode or S mode having a small conductance.

4. When a driving current flows through the driving transistor DRT in the light emission step S140, the voltage of the second node N2 of the driving transistor DRT increases. At this time, the organic light emitting diode OLED emits light with gray brightness corresponding to the gray display signal voltage Vdata–Vini charged in the first storage capacitor Cst.

The driving transistor DRT according to the above-described embodiment separates the data writing channel by the oxide semiconductor layer and the first gate node N1, and the data writing channel by the oxide semiconductor layer and the second gate electrode N2. Accordingly, in the sampling step S120, the fast sampling is performed on the driving transistor DRT using the F mode having a large conductance in which the driving transistor DRT operates by the sampling voltage formed in the second storage capacitor Cb. The data writing step S130 may increase the gray voltage margin displayed on the screen by using the S mode having a small conductance.

Figure 5:
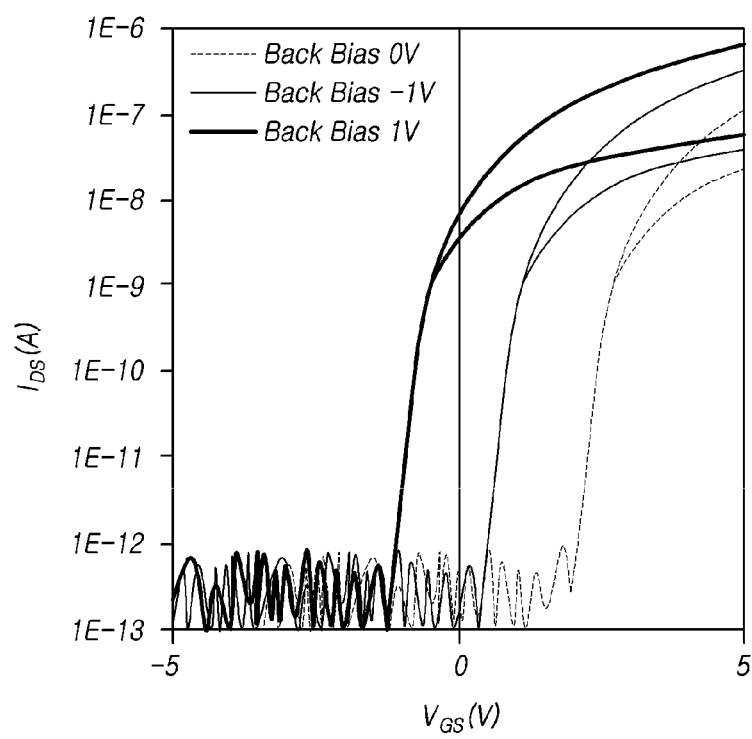
FIGS. 5 and 6 illustrate a shift characteristic of a threshold voltage of the driving transistor of FIG. 2.
Figure 6:
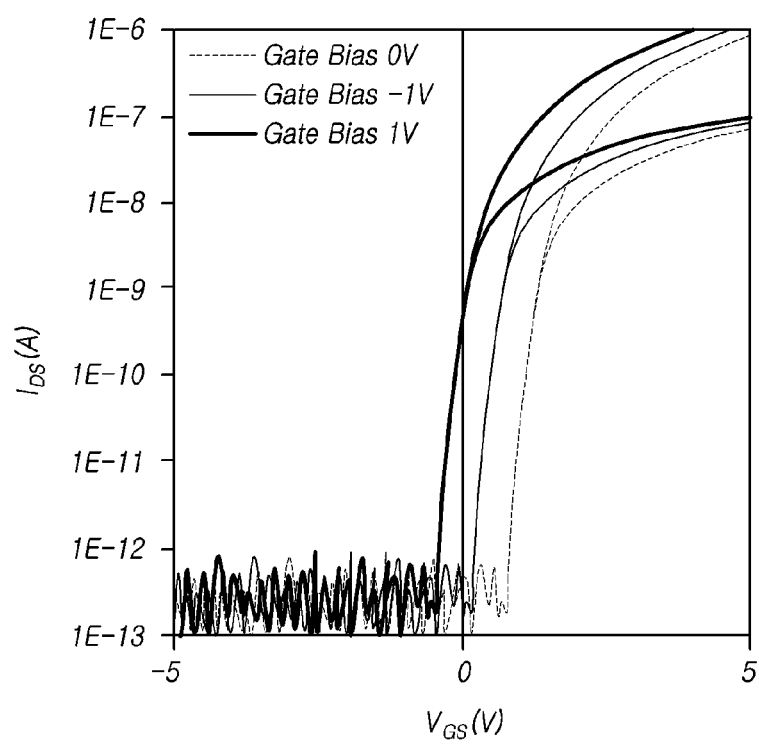

FIGS. 5 and 6 illustrate a shift characteristic of a threshold voltage of the driving transistor of FIG. 2.

In order to check the shift characteristics of the threshold voltage of the driving transistor DRT described with reference to FIG. 3, when an ON signal is applied to the first gate node 224 of the driving transistor DRT to use the top driving channel, the driving current Ids according to the source-gate voltage Vgs of the driving transistor DRT by the second gate node voltage or back bias voltage of 0V, −1V, and 1V was measured as shown in FIG. 5.

When an ON signal is applied to the second gate node 214 of the driving transistor DRT to use the sampling channel, the driving current Ids according to the source-gate voltage Vgs of the driving transistor DRT by the voltage of the first gate node N1 of 0V, −1V, and 1V was measured as shown in FIG. 6.

As shown in FIG. 5, when the top driving channel is used, it operates in the S-mode, thereby exhibiting a high S-factor and a relatively low driving current characteristic. Conversely, as shown in FIG. 6, when the sampling channel is used, it operates in the F-mode, thereby exhibiting a low S-factor and a relatively high driving current characteristic. The S-factor or sub-threshold swing expresses the characteristic of generating a leakage current by applying a voltage lower than the threshold voltage Vth, and affects the device performance (e.g., mobility, on-current characteristics, etc.) of the transistor along with the channel length.

As shown in FIGS. 5 and 6, the threshold voltage Vth due to the back bias using the second gate node N4 moves in parallel with little variation in the S-factor.

Figure 7A:
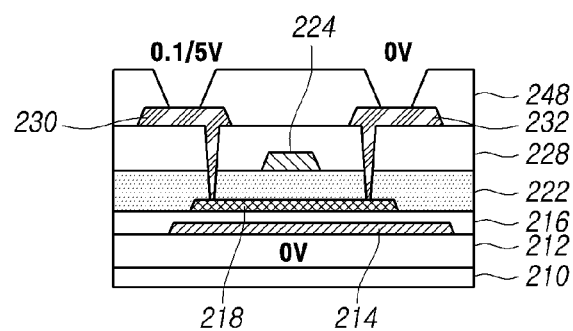
FIGS. 7A and 8A illustrate voltages of nodes of two driving transistors having different threshold voltages when operating in the S-mode using a top driving channel and operating in the F-mode using a sampling channel.
Figure 7B:
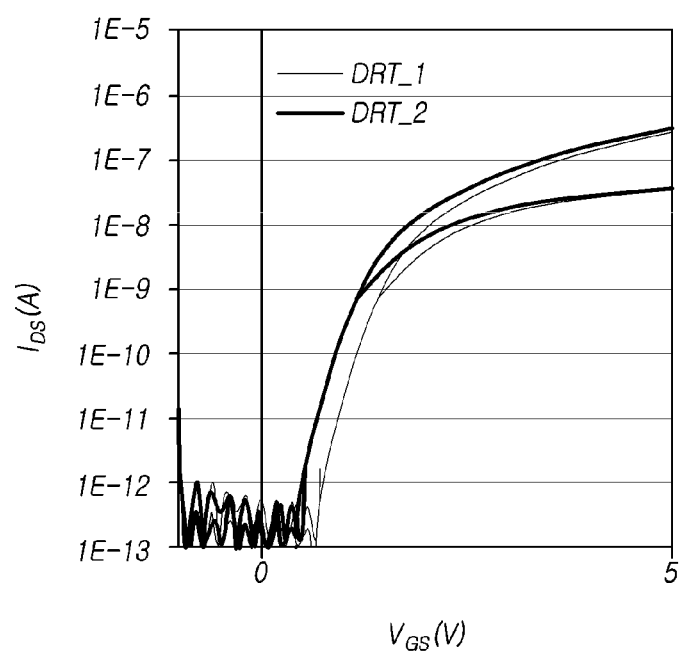
FIGS. 7B and 8B are results of simulating a compensation process for two driving transistors having different threshold voltages in FIGS. 7A and 8A.
Figure 8A:
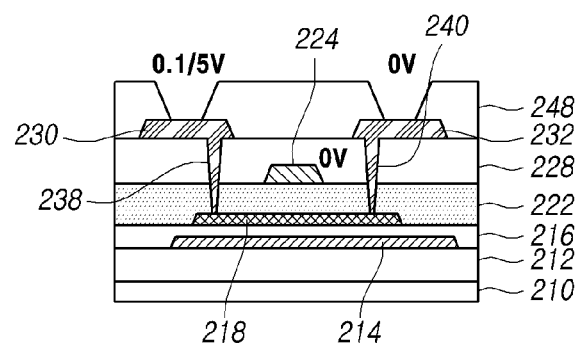
Figure 8B:
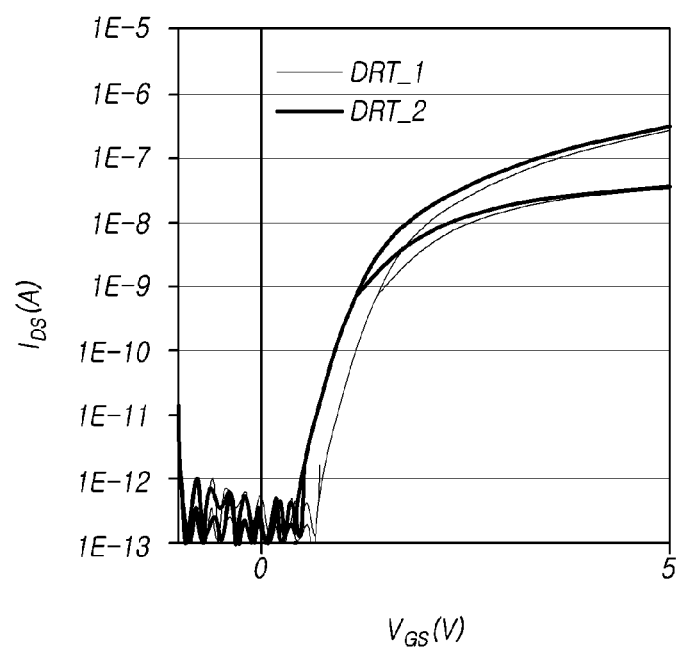

FIGS. 7A and 8A illustrate voltages of nodes of two driving transistors having different threshold voltages when operating in the S-mode using a top driving channel and operating in the F-mode using a sampling channel. FIGS. 7B and 8B are results of simulating a compensation process for two driving transistors having different threshold voltages in FIGS. 7A and 8A.

As shown in FIGS. 7A and 8A, in a state in which the source-drain voltages Vds are respectively set to 0.1V and 5V for two driving transistors DRT_1 and DRT_2 having different threshold voltages, the driving currents Ids according to the source-gate voltage Vgs of two driving transistors DRT_1 and DRT_2 having different threshold voltages Vth when operating in the S-mode using the top driving channel as shown in 7A and operating in the F-mode using the sampling channel as shown in FIG. 8A were measured as shown in FIGS. 7B and 8B.

As shown in FIGS. 7A and 8A, in order to set the source-drain voltage Vds for the two driving transistors DRT_1 and DRT_2 to 0.1V and 5V, respectively, 0V was applied to the source electrode 232 in FIG. 3 for two different driving transistors DRT_1 and DRT_2, and 0.1V and 5V were applied to the drain electrode 230 in FIG. 3, respectively.

As shown in FIG. 7A, in a state in which the source-drain voltages Vds are set to 0.1V and 5V for the two driving transistors DRT_1 and DRT_2 having different threshold voltages, when operating in the S-mode by using the top driving channel, threshold voltages of the two driving transistors DRT_1 and DRT_2 are shown in FIG. 7B and table 1.

TABLE 1

| 5 nA | Vth_0.1 V | Vth_5 V |
|---|---|---|
| DRT_1 | 2.07 V | 1.82 V |
| DRT_2 | 1.85 V | 1.59 V |

As shown in FIG. 8A, in a state in which the source-drain voltages Vds are respectively set to 0.1V and 5V for the two driving transistors DRT_1 and DRT_2 having different threshold voltages, when operating in the F-mode by using the sampling channel, threshold voltages of the two driving transistors DRT_1 and DRT_2 are shown in FIG. 8B and table 2.

TABLE 2

| 5 nA | Vth_0.1 V | Vth_5 V |
|---|---|---|
| DRT_1 | 1.24 V | 1.07 V |
| DRT_2 | 1.27 V | 1.15 V |

Figure 9A:
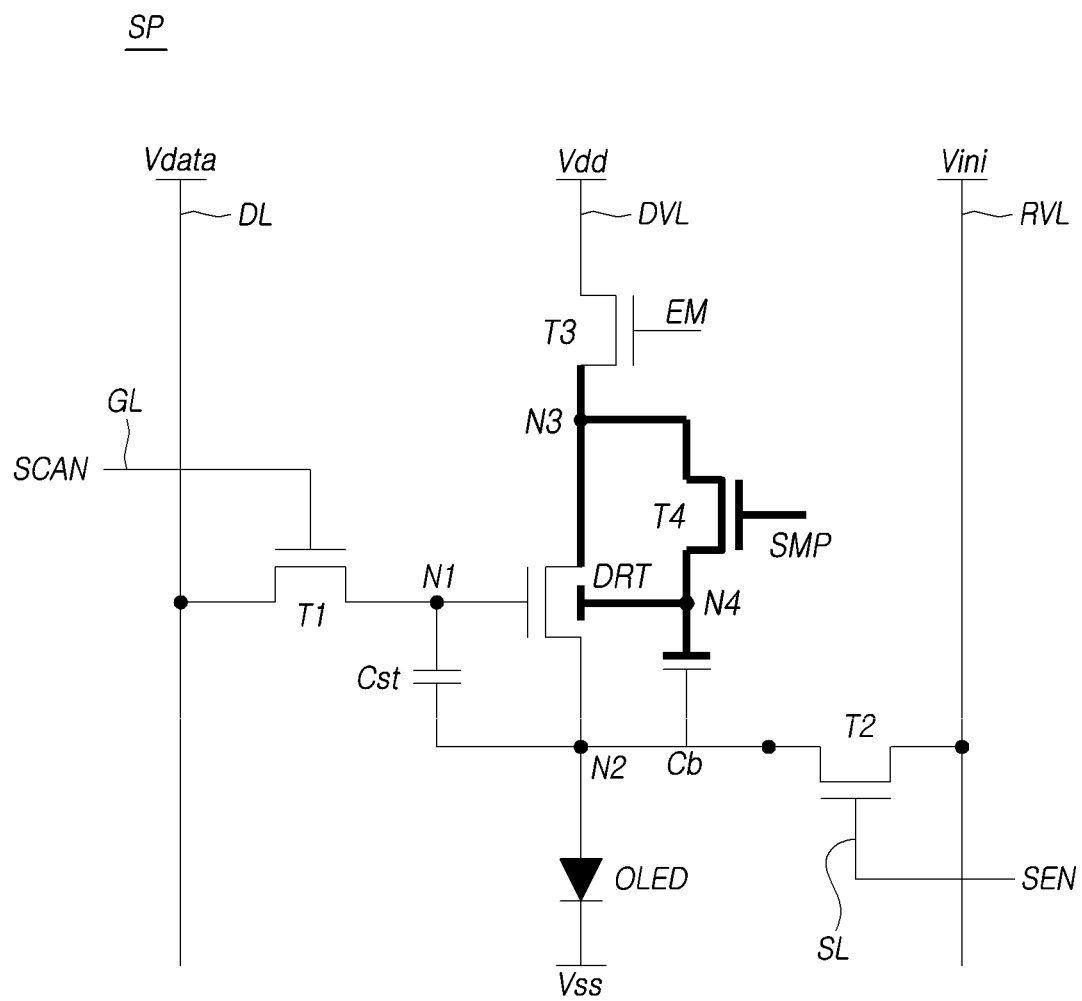
FIG. 9A is a circuit diagram of a state in which a threshold voltage is sensed in the sampling step in the subpixel of FIG. 4.
Figure 9B:
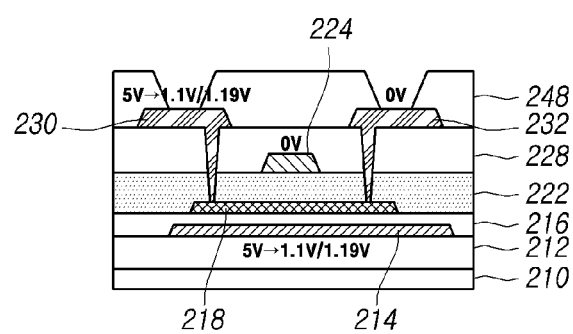
FIG. 9B illustrates voltages of nodes of the driving transistors DRT_1 and DRT_2 when the subpixel of FIG. 4 operates in an F-mode using a sampling channel in the sampling step.
Figure 9C:
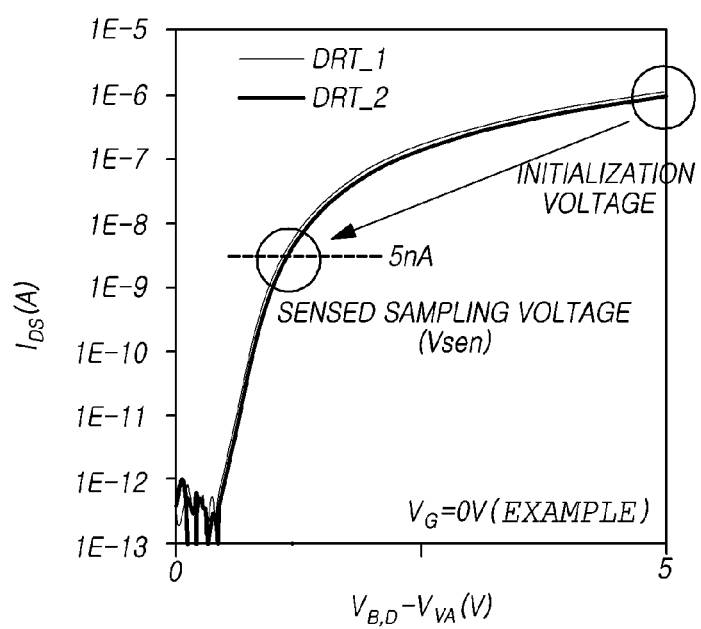
FIG. 9C illustrates results of simulating the compensation process for the driving transistors DRT_1 and DRT_2.

FIG. 9A is a circuit diagram of a state in which a threshold voltage is sensed in the sampling step in the subpixel of FIG. 4. FIG. 9B illustrates voltages of nodes of the driving transistors DRT_1 and DRT_2 when the subpixel of FIG. 4 operates in an F-mode using a sampling channel in the sampling step. FIG. 9C illustrates results of simulating the compensation process for the driving transistors DRT_1 and DRT_2.

As shown in FIG. 9A, in the initialization step S110, the first gate node N1 and the second node N2 are maintained at the reference voltage Vref and the initialization voltage Vini, and, in the sampling step S120, the fast sampling is performed on the driving transistor DRT using the F mode in which the driving transistor DRT operates by the sampling voltage Vsen formed in the second storage capacitor Cb.

As described above, in the sampling step S120, when the sensing signal SEN and the control signal SMP are kept on, and the enable signal EM is changed to the off state as shown in Table 3, the third transistor T3 is turned off so that the sampling voltage Vsen is formed in the second storage capacitor Cb.

TABLE 3

| Transistor | Whether to operate? |
|---|---|
| T1 | OFF |
| T3 | OFF |

TABLE 3-continued

| Transistor | Whether to operate? |
|---|---|
| T4 | ON |
| T2 | ON |

For example, when the initialization voltage Vini is 5V, the driving current of the driving transistors DRT_1 and DRT_2 flows, so that the voltage of the second node may go down from 5V of the initialization voltage Vini to the threshold voltage as shown in FIGS. 9B and 9C. Since the second transistor T2 is turned on, the sampling voltage Vsen sensed through the second transistor T2 is shown in FIGS. 9C and 4.

TABLE 4

| 5 nA | Vsen |
|---|---|
| DRT_1 | 1.11 V |
| DRT_2 | 1.19 V |

Figure 10A:
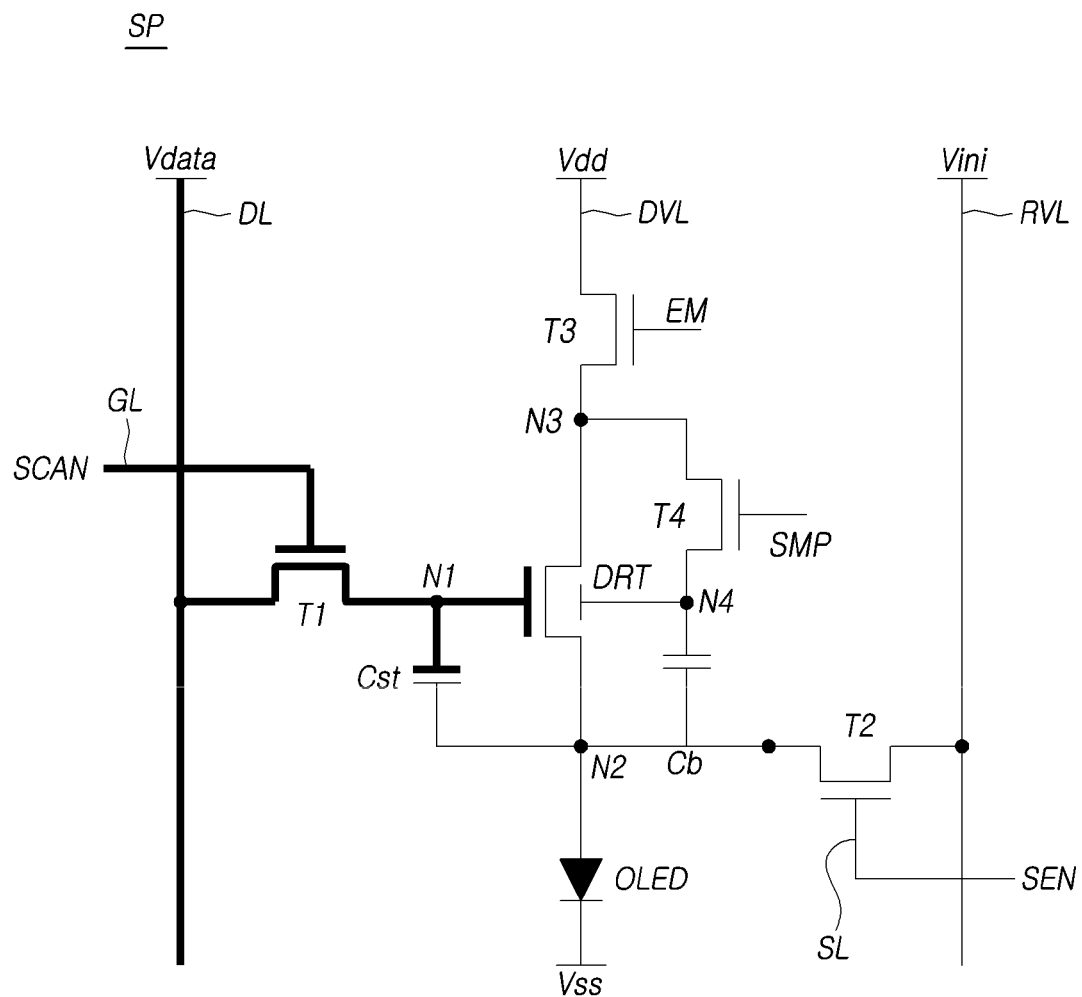
FIG. 10A is a circuit diagram of a data writing step in the subpixel of FIG. 4.
Figure 10B:
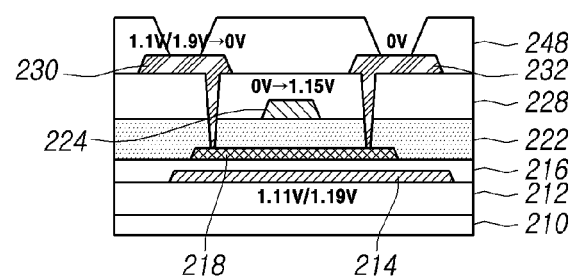
FIG. 10B illustrates voltages of nodes of the driving transistors DRT_1 and DRT_2 when operating in the S-mode using a top driving channel.
Figure 10C:
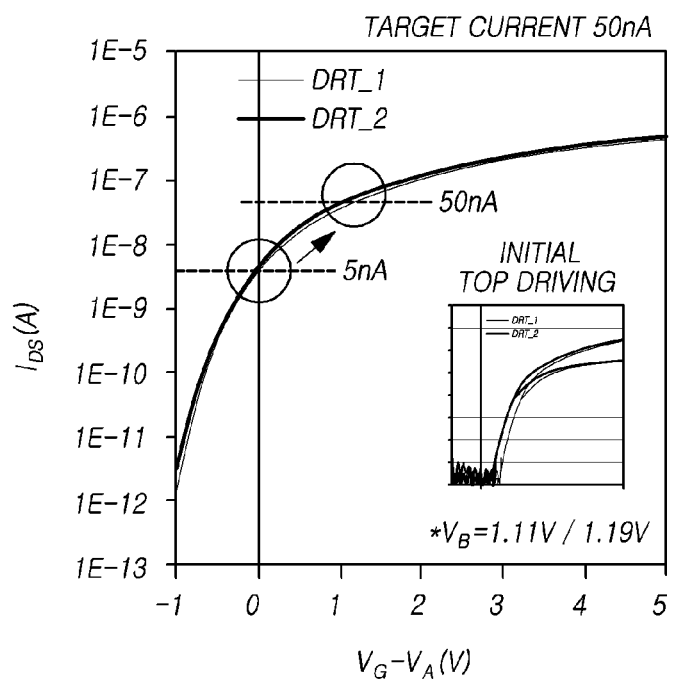
FIG. 10C is results of simulating the compensation process for the transistors DRT_1 and DRT_2.

FIG. 10A is a circuit diagram of a data writing step in the subpixel of FIG. 4. FIG. 10B illustrates voltages of nodes of the driving transistors DRT_1 and DRT_2 when operating in the S-mode using a top driving channel. FIG. 10C is results of simulating the compensation process for the transistors DRT_1 and DRT_2.

As shown in FIG. 10A, in a state in which the sampling voltage Vsen is stored in the second storage capacitor Cb in the data writing step S130, the third transistor T3 is turned off as shown in Table 5, and in a state in which no current flows through the driving transistor DRT, the scan signal SCAN is turned on to apply the data voltage Vdata to the first gate node N1.

TABLE 5

| Transistor | Whether to operate? |
|---|---|
| T1 | ON |
| T3 | OFF |
| T4 | OFF |
| T2 | ON |

As a result, the driving transistor DRT may increase the gray voltage margin displayed on the screen by using the S mode having a small conductance.

Since the third transistor T3 is kept off while the sampling voltage Vsen is charged in the second storage capacitor Cb, the voltage of the fourth node N4 continues to decrease and reaches 0V.

For example, when the data voltage Vdata is 1.5V, Vgs=1.15V is stored in the first storage capacitor Cst as shown in FIG. 10B and table 6.

TABLE 6

| 50 nA | Vth target |
|---|---|
| DRT_1 | 1.15 V |
| DRT_2 | 1.15 V |

As shown in FIG. 10C, when operating in the S-mode using the top driving channel, a curve in which the threshold voltage Vth is compensated by the back bias compared to the initial top driving channel may be confirmed and the characteristics of the S-factor of the top driving channel may be checked.

Figure 11A:
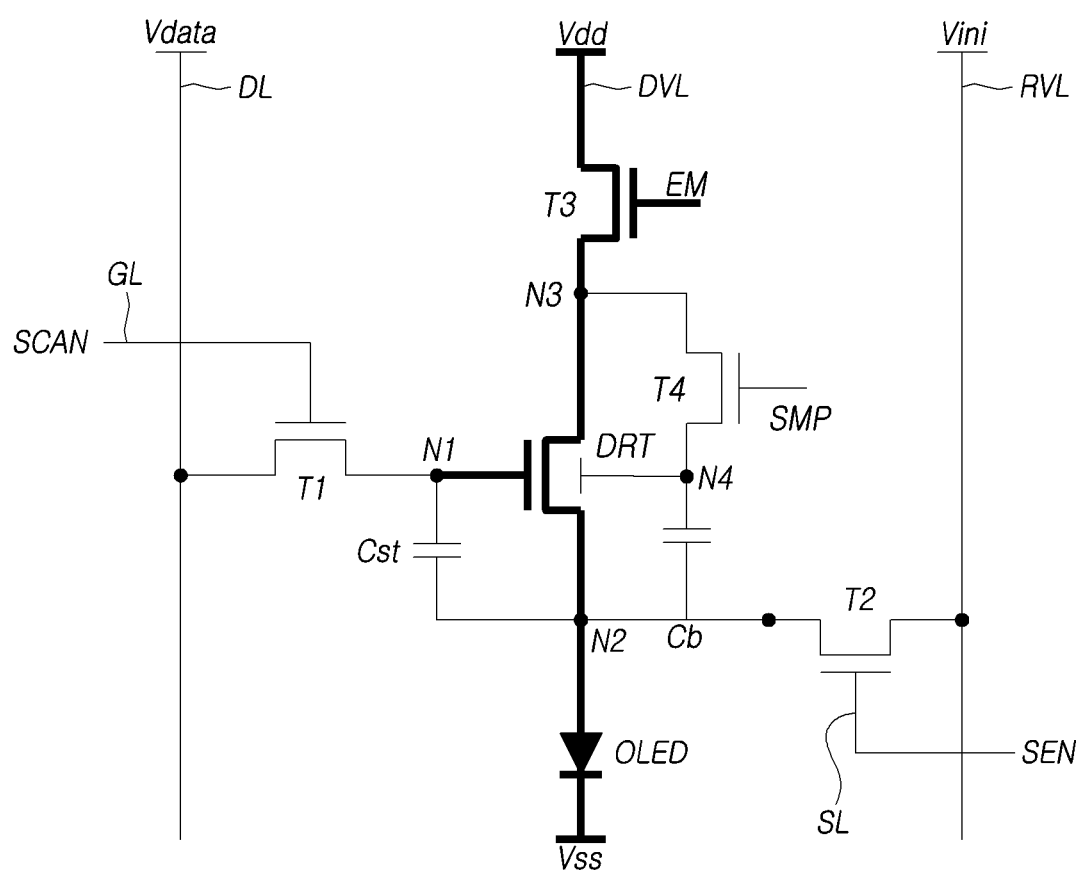
FIG. 11A is a circuit diagram of a light emission step in the subpixel of FIG. 4.
Figure 11B:
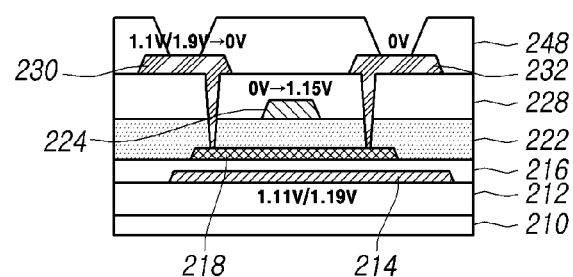
FIG. 11B illustrates voltages of nodes of the driving transistors DRT_1 and DRT_2 in the light emission step in the subpixel of FIG. 4.
Figure 11C:
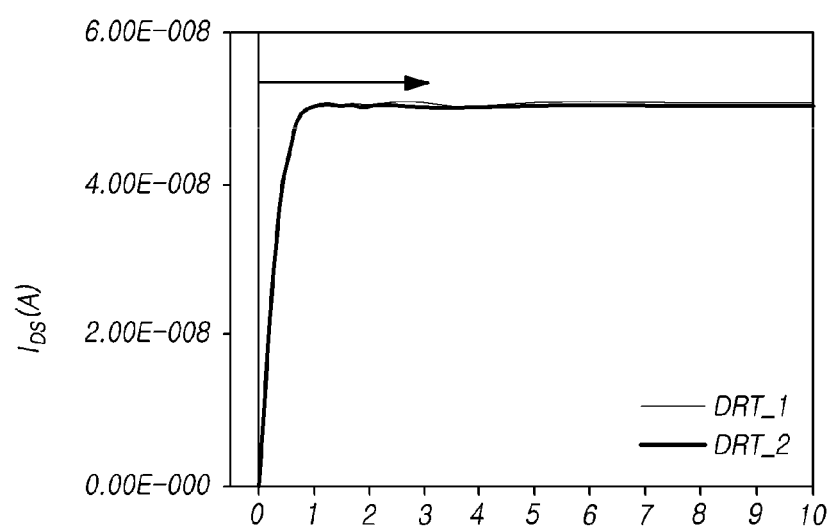
FIG. 11C is a result of measuring the driving current Ids according to the source-gate voltage Vgs of the driving transistors DRT_1 and DRT_2.

FIG. 11A is a circuit diagram of a light emission step in the subpixel of FIG. 4. FIG. 11B illustrates voltages of nodes of the driving transistors DRT_1 and DRT_2 in the light emission step in the subpixel of FIG. 4. FIG. 11C is a result of measuring the driving current Ids according to the source-gate voltage Vgs of the driving transistors DRT_1 and DRT_2.

FIGS. 11A and 11B, in a state in which the data voltage Vdata is stored in the first storage capacitor Cst in the light emission step S140, the third transistor T3 is turned on as shown in Table 7 so current flows through the driving transistor DRT. As shown in FIG. 11C, the target current finally flows, and the voltage of the second node N2 of the driving transistor DRT increases to reach the saturation region. After reaching the saturation region while the lower back bias voltage is fixed, there is no fluctuation in current according to the fluctuation or increase of the drain-source voltage Vds.

TABLE 7

| Transistor | Whether to operate? |
|---|---|
| T1 | OFF |
| T3 | ON |
| T4 | OFF |
| T2 | OFF |

Figure 12:
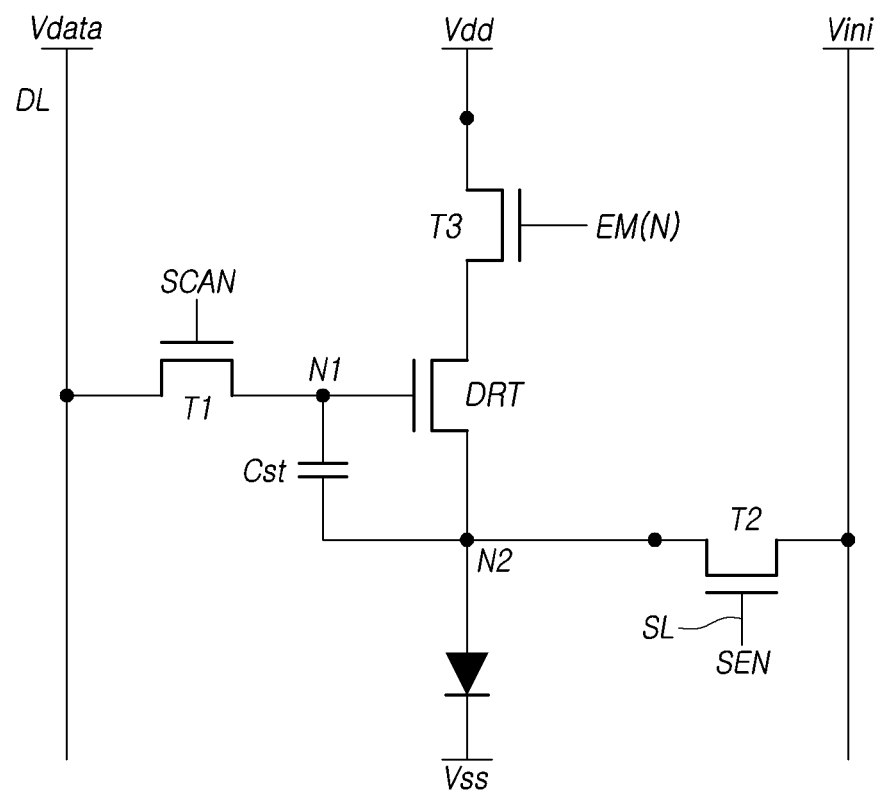
FIG. 12 is a circuit diagram of a subpixel having a general 4T1C structure as a comparative example.

FIG. 12 is a circuit diagram of a subpixel having a general 4T1C structure as a comparative example.

Referring to FIG. 12, a subpixel SP having a general 4T1C structure as a comparative example is different from the subpixel SP according to the embodiment described with reference to FIG. 2 in that it includes an organic light emitting diode OLED, a driving transistor DRT for driving the organic light emitting diode OLED, and a first transistor T1, the second transistor T2, the third transistor T3, the first storage capacitor Cst, and the gate node of the driving transistor is only one.

Figure 13A:
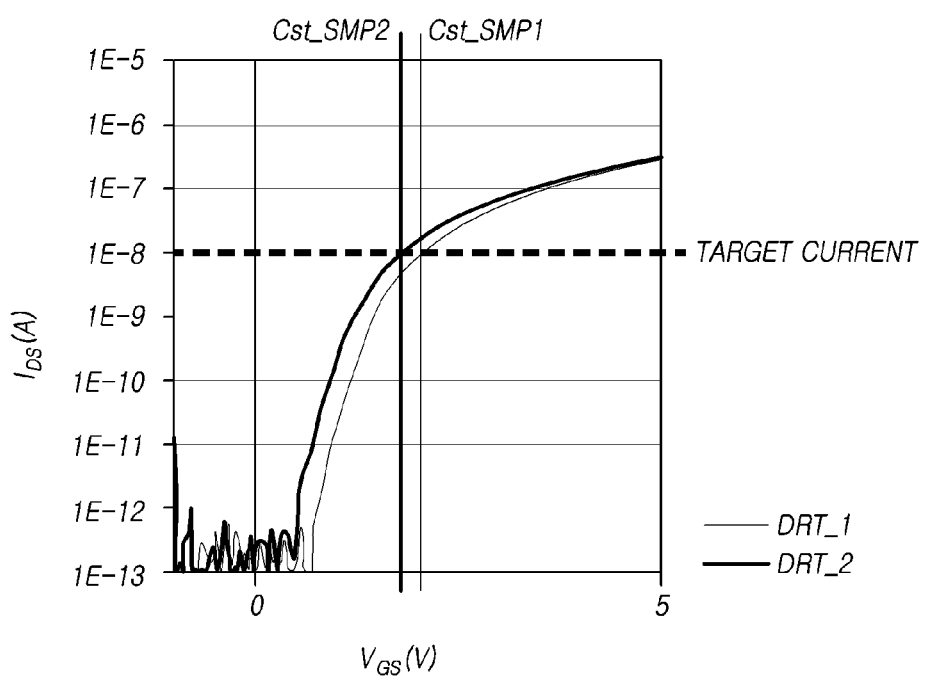
FIG. 13A is a result of measuring the driving current Ids according to the source-gate voltage Vgs of the driving transistors DRT_1 and DRT_2 by the general compensation process of the subpixel of the general 4T1C structure of FIG. 12.

FIG. 13A is a result of measuring the driving current Ids according to the source-gate voltage Vgs of the driving transistors DRT_1 and DRT_2 by the general compensation process of the subpixel of the general 4T1C structure of FIG. 12.

The threshold voltage Vth of the driving transistor DRT is stored in the first storage capacitor Cst. The data voltage Vdata is additionally applied to the source-gate voltage Vgs stored in the first storage capacitor Cst.

Accordingly, as shown in FIG. 13A, different voltages (e.g., 1.8V+Vdata or 1.6V+Vdata) are stored in the storage capacitor as shown in Table 8 according to the threshold voltage Vth based on the driving transistors.

TABLE 8

| | | DRT_1 | DRT_2 |
|---|---|---|---|
| Cst | Threshold voltage sampling | 1.8 V | 1.6 V |
| | Data writing | 1.8 V + Vdata | 1.6 V + Vdata |

Figure 13B:
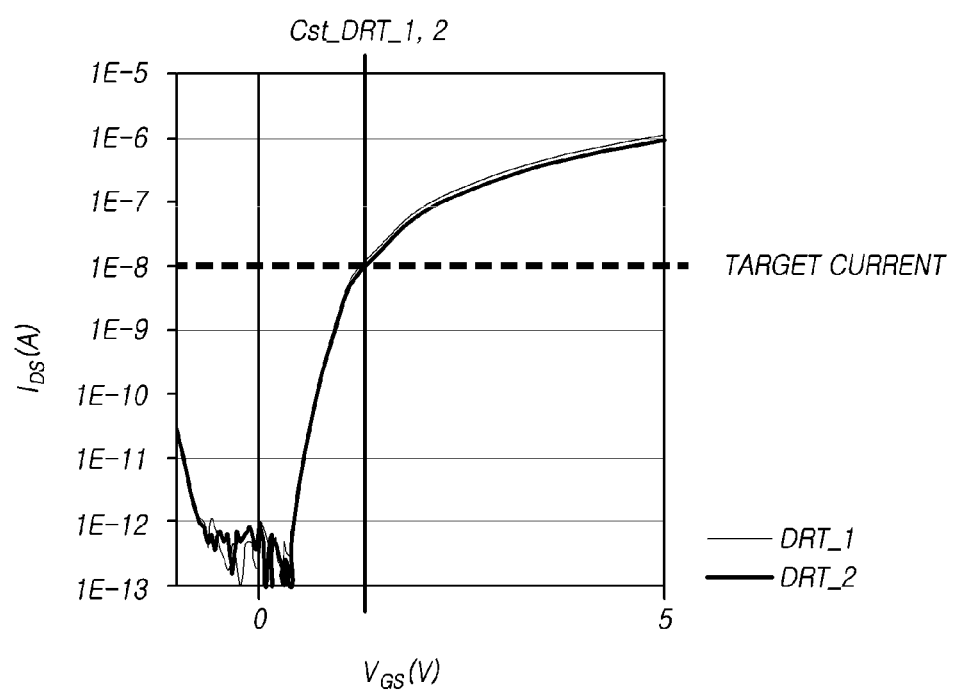
FIG. 13B is a result of measuring the driving current Ids according to the source-gate voltage Vgs of the driving transistors DRT_1 and DRT_2 by the compensation process of the subpixel according to the embodiment of FIG. 2.

FIG. 13B is a result of measuring the driving current Ids according to the source-gate voltage Vgs of the driving transistors DRT_1 and DRT_2 by the compensation process of the subpixel according to the embodiment of FIG. 2.

Referring to FIG. 13B, the threshold voltages Vth of the driving transistors DRT_1 and DRT_2 are not directly compensated, but is compensated through a back bias using the second storage capacitor Cb. Accordingly, since the driving transistors DRT_1 and DRT_2 are self-compensated through back bias compensation, the same data voltage Vdata may be applied to the first storage capacitor Cst regardless of the threshold voltage Vth.

TABLE 9

|  |  | DRT_1 | DRT_2 |
| --- | --- | --- | --- |
| Cst | Threshold voltage sampling | 1.11 V | 1.19 V |
|  | Data writing | Vdata | Vdata |

The circuit structure, the driving method, and effect of the subpixel according to the embodiment illustrated in FIG. 2 have been described above with reference to the drawings. Hereinafter, subpixels according to another embodiments will be described.

Figure 14:
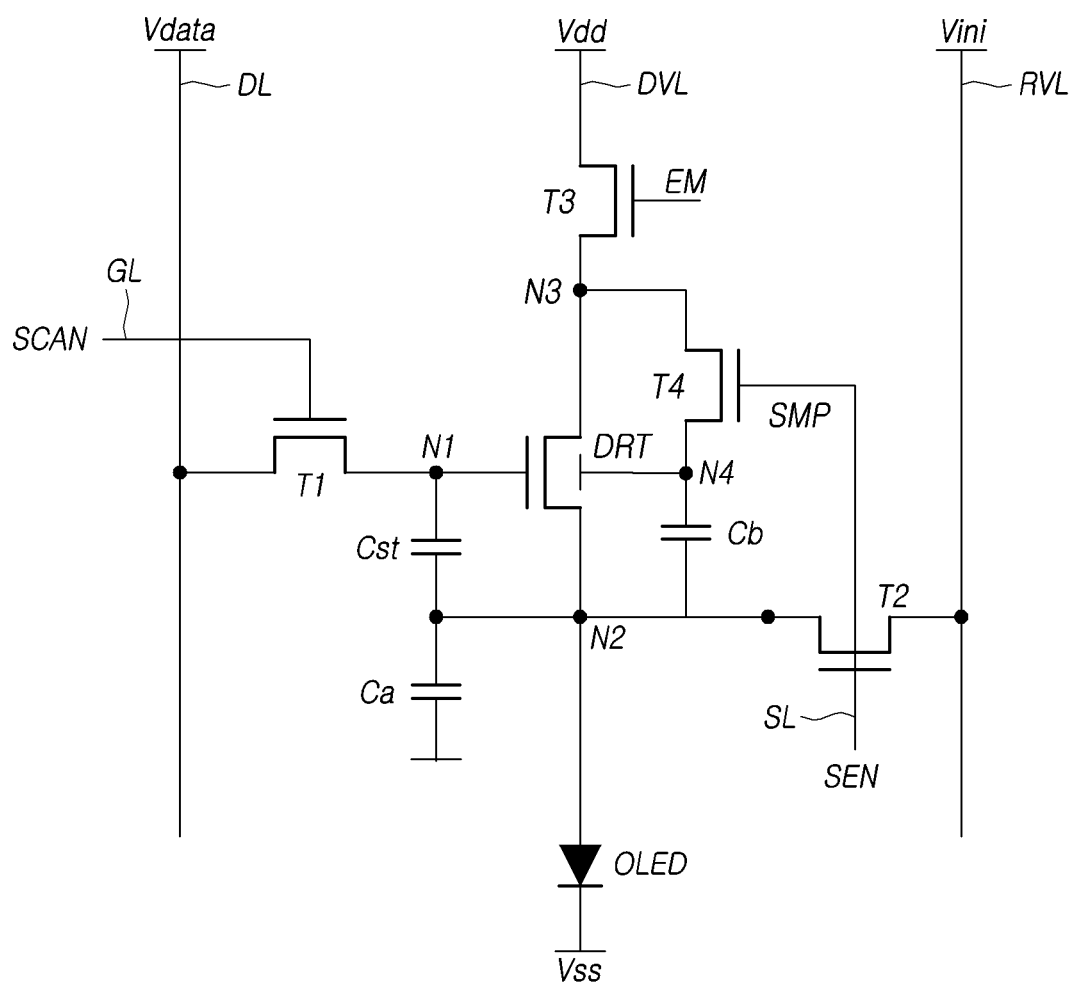
FIG. 14 is a circuit diagram of a subpixel SP1 according to another embodiment.

FIG. 14 is a circuit diagram of a subpixel according to another embodiment.

Referring FIG. 14, a subpixel SP1 according to another embodiment is the same as the subpixel SP according to the embodiment described above in that it includes an organic light emitting diode OLED, a driving transistor DRT for driving the organic light emitting diode OLED, and a first transistor T1, a second transistor T2, a third transistor T3, a fourth transistor T4, a first storage capacitor Cst, a second storage capacitor Cb, etc.

The subpixel SP1 according to another embodiment is substantially the same as the circuit structure of the subpixel SP according to the embodiment described with reference to FIG. 2 except that it includes further a third storage capacitor Ca between the second node N2 of the driving transistor DRT and a different voltage source, for example, the driving voltage VDD, and the gates of the second transistor T2 and the fourth transistor T4 are formed in common to apply a control signal through a single signal line.

That is, it may have a 5T3C structure including five transistors and three capacitors.

Figure 15:
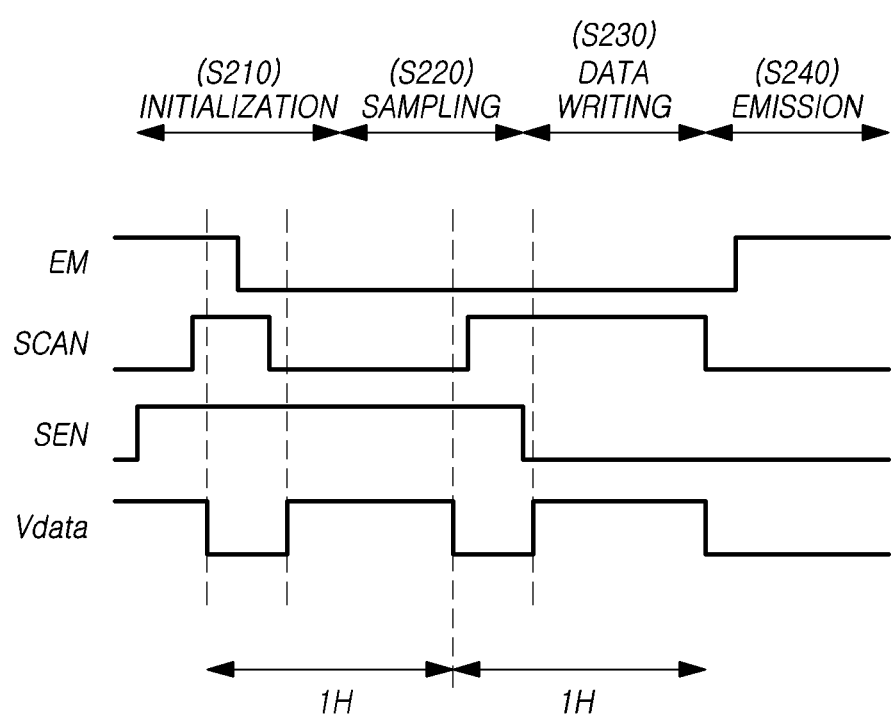
FIG. 15 illustrates an example of a method of driving the subpixel SP1 of FIG. 14.

FIG. 15 illustrates an example of a method of driving the subpixel SP of FIG. 14.

Referring to FIG. 15, the driving method of driving the subpixel SP of FIG. 14 includes an initialization step S210, a sampling step S220, a data writing step S230, and a light emission step S240.

The initialization step S210 and the sampling step S220 are the same as the initialization step S110 and the sampling step S120 described with reference to FIG. 4.

In the data writing step S230, in a state in which the third transistor T3 is turned off and the current does not flow through the driving transistor DRT, when the first transistor T1 is turned on and the data voltage Vdata is applied to the first node N1 of the driving transistor DRT, the second node N2 of the driving transistor DRT is floated, and a voltage having a transfer rate of a (Vdata−Vini) is added to the first storage capacitor Cst.

When the current flows through the driving transistor DRT in the light emission step S240, the voltage of the second node N2 of the driving transistor DRT increases. At this time, the light emitting diode OLED emits light with gray brightness corresponding to the gray display signal voltage Vdata−Vini charged in the first storage capacitor Cst.

Figure 16:
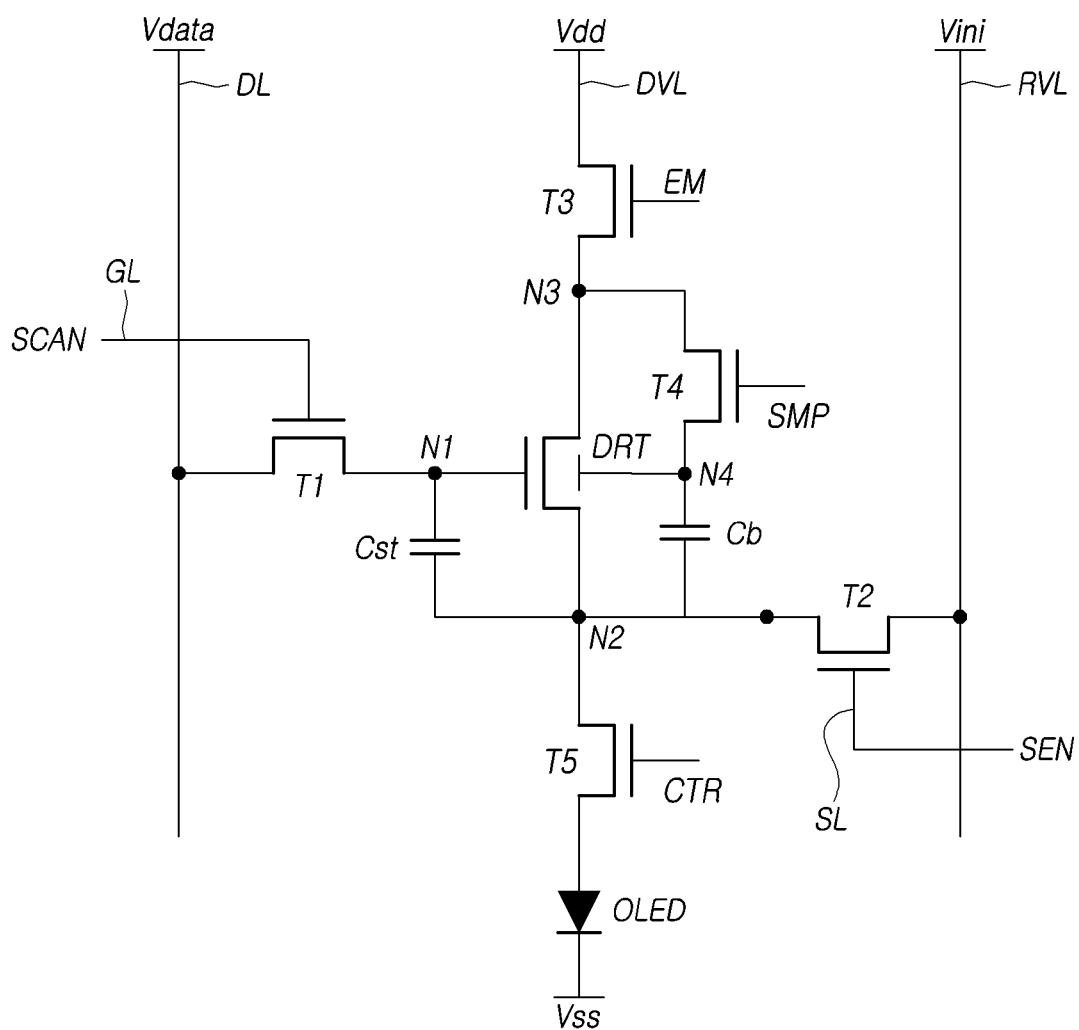
FIG. 16 is a circuit diagram of a subpixel SP2 according to another embodiment.

FIG. 16 is a circuit diagram of a subpixel according to another embodiment.

Referring to FIG. 16, a subpixel SP2 according to another embodiment is substantially the same as the sub-pixel SP according to the embodiment described with reference to FIG. 2 in that it includes an organic light emitting diode OLED, a driving transistor DRT for driving the organic light emitting diode OLED, and a first transistor T1, a second transistor T2, a third transistor T3, a fourth transistor T4, a first storage capacitor Cst, and a second storage capacitor Cb.

The subpixel SP2 according to another embodiment is substantially the same as the circuit structure of the subpixel SP according to the embodiment described with reference to FIG. 2 except that it further includes a fifth transistor T5 between the second node N2 of the driving transistor DRT and the first electrode of the organic light emitting diode OLED.

That is, it may have a 6T2C structure including six transistors and two capacitors.

That is, the initialization voltage of the second node N2 may be set to be greater than or equal to the turn-on voltage of the base voltage VSS by using the fifth transistor T5. A separate signal may be set or a signal such as a sensing signal SEN or a control signal SMP may be used together as the control signal CTR of the fifth transistor T5. The fifth transistor T5 may be turned on in the light emission step, but other periods may be selectively intermitted as necessary.

Figure 17:
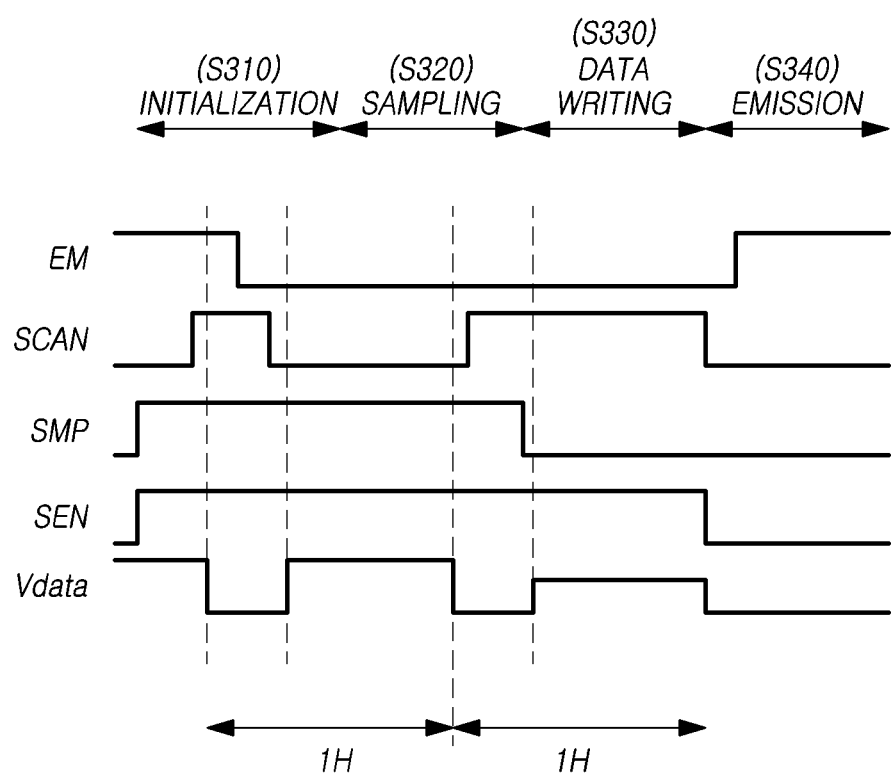
FIG. 17 illustrates an example of a method of driving the subpixel SP2 of FIG. 16.

FIG. 17 shows an example of a method of driving the subpixel SP of FIG. 16.

Referring to FIG. 17, the driving method of driving the subpixel SP2 of FIG. 16 includes an initialization step S310, a sampling step S320, a data writing step S330, and a light emission step S340.

The initialization step S310, the sampling step S320, the data writing step S330 and the light emission step S340 are basically the same as the initialization step S110 and the sampling step S120, and the data writing step S130 and the light emission step S140 described with reference to FIG. 4.

In the light emission step S340, the driving transistor DRT and the organic light emitting diode OLED are electrically separated and then electrically connected in the light emission step S340 in which the organic light emitting diode OLED emits light. That is, since the fifth transistor T5 is turned on in the light emission step S340, the initialization voltage Vini of the second node N2 may be set to be equal to or greater than the turn-on voltage of the base voltage VSS.

Figure 18:
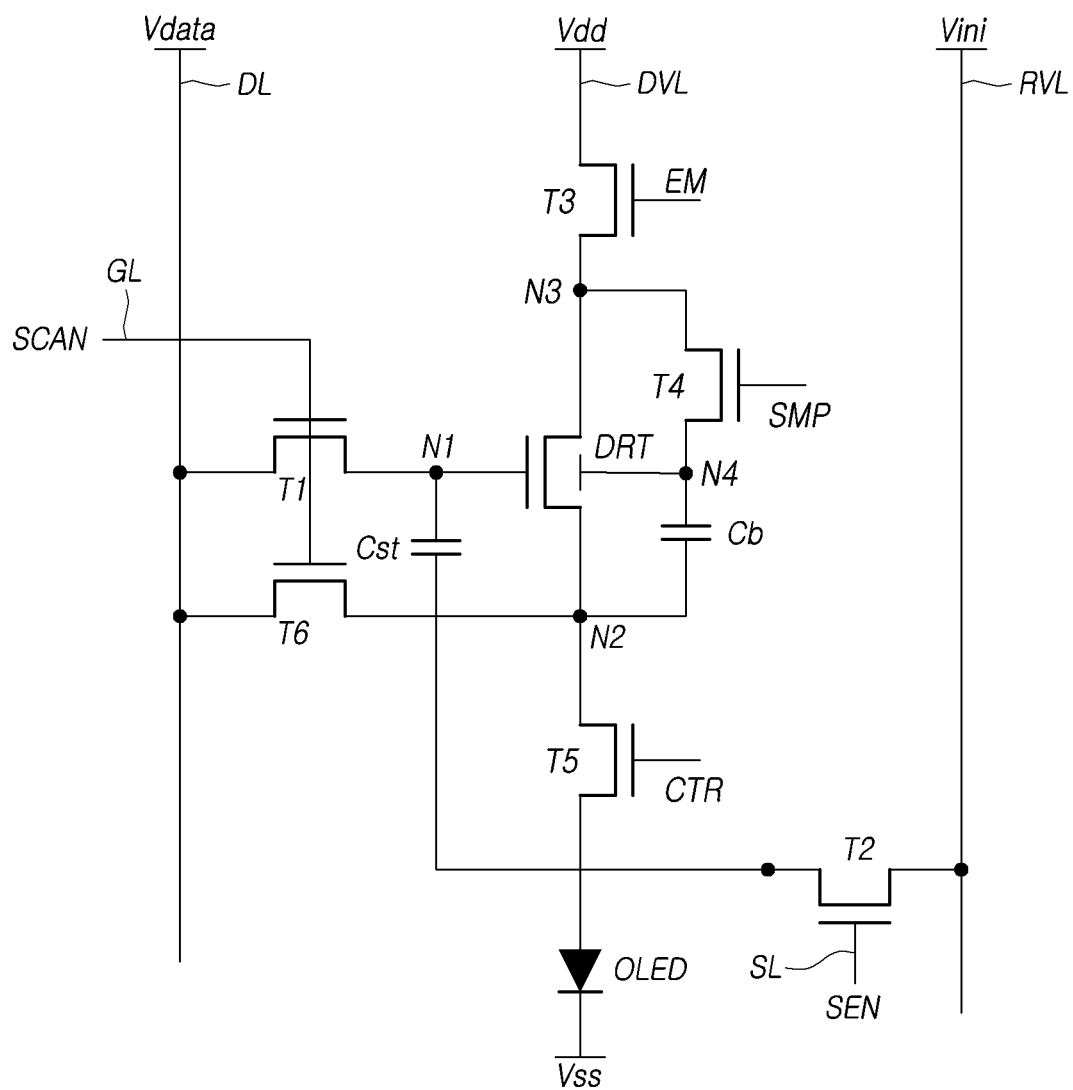
FIG. 18 is a circuit diagram of a subpixel SP3 according to another embodiment.

FIG. 18 is a circuit diagram of a subpixel SP according to another embodiment.

Referring to FIG. 18, a subpixel SP3 according to another embodiment is substantially the same as the sub-pixel SP according to the embodiment described with reference to FIG. 2 in that it includes an organic light emitting diode OLED, a driving transistor DRT for driving the organic light emitting diode OLED, and a first transistor T1, a second transistor T2, a third transistor T3, a fourth transistor T4, a first storage capacitor Cst, and a second storage capacitor Cb.

The subpixel SP3 according to another embodiment is the same as the circuit structure of the subpixel SP2 according to the embodiment described with reference to FIG. 16 except that it further includes a sixth transistor T6 between the second node N2 of the driving transistor DRT and the data line DL, and the gate node of the transistor T6 is electrically connected to the gate node of the first transistor T1.

That is, it may have a 7T2C structure including seven transistors and two capacitors.

That is, during the F mode of sampling, the data voltage Vdata is applied to the first node N1 and the second node N2, and the sampling voltage Vsen is charged in the second storage capacitor Cb by a fluctuation in the voltage of the second node N2.

Even if the data voltage Vdata fluctuates during the sampling, it does not affect sampling, so there is no limitation on the sampling time.

FIG. 19 illustrates an example of a method of driving the subpixel SP of FIG. 18.

Referring to FIG. 19, the driving method of driving the subpixel SP3 of FIG. 18 includes an initialization step S410, a sampling step S420, a data writing step S430, and a light emission step S440.

The initialization step S410, the sampling step S420, the data writing step S430, and the light emission step S440 are basically the same as the initialization step S110, the sampling step S120 the data writing step S130 and the light emission step S140 described with reference to FIG. 4.

However, since the fifth transistor T5 is turned on in the light emission step S440, the initialization voltage of the second node N2 of the driving transistor DRT is set to be greater than or equal to the turn-on voltage of the base voltage VSS. During the F mode of the sampling step S420, the reference voltage Vref and the initialization voltage Vini are applied to the first node N1 and the second node N2, and the sampling voltage Vsen may be formed in the second storage capacitor Cb by a fluctuation in the voltage of the second node N2.

The sub-pixels SP, SP1, SP2, and SP3 according to the above-described embodiments have the following effects.

1. As described above, the subpixels SP, SP1, SP2, and SP3 according to the embodiments separate a data writing channel and a sampling channel. Accordingly, in the sampling step, fast sampling is performed using an F mode having a large conductance in which the driving transistor DRT operates by the sampling voltage formed in the second storage capacitor Cb. In the data writing step, the gray voltage margin displayed on the screen can be increased by using the S mode with a small conductance.

2. When the difference between the reference voltage Vref and the initialization voltage Vref−Vini in the sampling step by expanding the margin of the threshold voltage Vth of the driving transistor DRT is negative s that the threshold voltage Vth may be negative, it may be sampled.

3. Since the source voltage of the driving transistor DRT is fixed during the sampling step, it is possible to remove the settling deviation due to the difference in the source voltage or potential after sampling.

4. As shown in FIG. 4 or the like, during the sampling operation, the first gate node can be temporarily separated from the data voltage, so that the sampling time can be increased to 1H (one horizontal period) or more.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
an organic light-emitting diode including a first electrode;
a driving transistor electrically coupled between the first electrode of the organic light emitting diode and a driving voltage line, the driving transistor including a second node, a first gate node, and a second gate node;
a first transistor electrically coupled between the first gate node of the driving transistor and a data line;
a second transistor electrically coupled to a sensing line;
a first storage capacitor electrically coupled between the first gate node and the second node of the driving transistor;
a third transistor electrically coupled between the driving voltage line and the driving transistor;
a fourth transistor electrically coupled between the third transistor and the second gate node of the driving transistor, the fourth transistor including a second node; and
a second storage capacitor electrically coupled between the second gate node and the second node of the driving transistor,
wherein the first gate node is located either above or below a channel layer of the driving transistor,
when the first gate node is located above the channel layer of the driving transistor, the second gate node is located below the channel layer of the driving transistor, and
when the first gate node is located below the channel layer of the driving transistor, the second gate node is located above the channel layer of the driving transistor, and
the second gate node is electrically coupled to the second node of the fourth transistor through a contact hole.

2. The display device of claim 1, wherein the channel layer is an oxide semiconductor layer, and
wherein a capacitance of an insulating layer between the oxide semiconductor layer and the second gate node is smaller than that of the insulating layer between the oxide semiconductor layer and the first gate node.

3. The display device of claim 1, wherein a thickness of an insulating layer between the oxide semiconductor layer and the second gate node is thinner than that of the insulating layer between the oxide semiconductor layer and the first gate node.

4. The display device of claim 1, wherein a dielectric constant of an insulating layer between the oxide semiconductor layer and the second gate node is lower than that of the insulating layer between the oxide semiconductor layer and the first gate node.

5. The display device of claim 1, further comprising a third storage capacitor electrically coupled between the second node of the driving transistor and a base voltage, wherein the gates of the second transistor and the fourth transistor are connected in common.

6. The display device of claim 1, further comprising a fifth transistor electrically coupled between the second node of the driving transistor and the first electrode of the organic light emitting diode.

7. The display device of claim 1, further comprising a sixth transistor electrically coupled between the second node of the driving transistor and the data line, wherein a gate node of the sixth transistor is commonly connected to a gate node of the first transistor.

8. The display device of claim 1, wherein sampling for sensing a sampling voltage is performed using a fast mode in which the driving transistor operates by the sampling voltage formed in the second storage capacitor, and
wherein data writing is performed using a slow mode in which the driving transistor operates by a data voltage formed in the first storage capacitor.

9. A driving method for driving a driving circuit including an organic light emitting diode, a driving transistor driving the organic light emitting diode and including a first gate electrode and a second gate electrode, a first storage capacitor electrically coupled between the organic light emitting diode, a specific node of the driving transistor and the first gate electrode, and a second storage capacitor electrically coupled between the specific node and the second gate electrode, the driving method comprising:
storing a difference value between a reference voltage and an initialization voltage in the first storage capacitor;
storing a difference value between a driving voltage and an initialization voltage in the second storage capacitor to initialize;
performing sampling for sensing a sampling voltage using a fast mode in which the driving transistor operates by a sampling voltage stored in the second storage capacitor;
performing data writing using a slow mode in which the driving transistor operates by a data voltage stored in the first storage capacitor; and
emitting light from the organic light emitting diode by a driving current of the driving transistor.

10. The method of claim 9, wherein in performing the data writing, the data voltage is applied to a first gate electrode of the driving transistor and a source node of the driving transistor is floated.

11. The display device of claim 9, wherein the driving transistor and the organic light emitting diode are electrically separated from each other and then electrically coupled when emitting light from the organic light emitting diode.

12. The method of claim 9, wherein in performing sampling for sensing the sampling voltage, a reference voltage is simultaneously applied to a first gate electrode and a source of the driving transistor, and a sampling voltage formed on the second storage capacitor is sensed.

13. A display device comprising:
an organic light-emitting diode;
a driving voltage line configured to supply a driving voltage;
a data line configured to supply a data value;
a sensing line configured to supply an initialization voltage;
a driving transistor including a first gate node, a second gate node, a first electrode, and a second electrode, the driving transistor coupled between the organic light emitting diode and the driving voltage line;
a first transistor coupled between the first gate node of the driving transistor and the data line;
a second transistor coupled to the sensing line;
a first storage capacitor coupled to the first gate node of the driving transistor;
a third transistor coupled between the driving voltage line and the second electrode of the driving transistor;
a fourth transistor coupled between the second electrode and the second gate node of the driving transistor; and
a second storage capacitor coupled between the second gate node and the first electrode of the driving transistor,
wherein the data value is a current or voltage value and first gate node is located either above or below a channel layer of the driving transistor,
when the first gate node is located above the channel layer of the driving transistor, the second gate node is located below the channel layer of the driving transistor, and
when the first gate node is located below the channel layer of the driving transistor, the second gate node is located above the channel layer of the driving transistor.

14. The display device of claim 13, further comprising a third storage capacitor coupled in series with the first storage capacitor, wherein one electrode of the third storage capacitor is coupled to the first electrode of the driving transistor, and
wherein the first storage capacitor is coupled to between the first gate node and the first electrode of the driving transistor.

15. The display device of claim 14, wherein the data value is a voltage value and second transistor includes a gate node configured to switch the second transistor on and off and the fourth transistor includes a gate node configured to switch the fourth transistor on and off, and
wherein the gate node of the second transistor and the gate node of fourth transistor are commonly coupled.

16. The display device of claim 13, further comprising a fifth transistor coupled between the first electrode of the driving transistor and the organic light emitting diode, and
wherein the first storage capacitor is coupled to between the first gate node and the first electrode of the driving transistor.

17. The display device of claim 13, further comprising a fifth transistor coupled between the first electrode of the driving transistor and the organic light emitting diode,
wherein the first storage capacitor is coupled to between the first gate node and the second transistor.

18. The display device of claim 17, further comprising a sixth transistor coupled between the first electrode of the driving transistor and the data line,
wherein the first transistor includes a gate node configured to switch the first transistor on and off and the sixth transistor includes a gate node configured to switch the sixth transistor on and off, and
wherein the gate node of the first transistor and the gate node of the sixth transistor are commonly coupled.

* * * * *